(12) United States Patent
Santos et al.

(10) Patent No.: US 10,143,097 B2
(45) Date of Patent: Nov. 27, 2018

(54) HOUSING AND COMPLEMENTARY SNAP-FIT BRACKET

(71) Applicant: Rockwell Automation Technologies, Inc., Mayfield Heights, OH (US)

(72) Inventors: Roberto S. Santos, Hudson, MA (US); Steven R. Tambeau, Marlborough, MA (US); Brian J. Taylor, Boston, MA (US); Burt Sacherski, Nashua, NH (US); Elik I. Fooks, Lexington, MA (US); Suresh R. Nair, Amherst, NH (US); Michael Flannery, Groton, MA (US); Scott Wakefield, Andover, MA (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 15/482,022

(22) Filed: Apr. 7, 2017

(65) Prior Publication Data
US 2018/0295732 A1 Oct. 11, 2018

(51) Int. Cl.
*H05K 5/02* (2006.01)
*F16M 13/02* (2006.01)
*F16B 2/22* (2006.01)

(52) U.S. Cl.
CPC ............. *H05K 5/0204* (2013.01); *F16B 2/22* (2013.01); *F16M 13/02* (2013.01); *H05K 5/0217* (2013.01)

(58) Field of Classification Search
CPC ...... H05K 5/0204; H05K 5/0217; H05K 7/14; F16M 13/02; F16B 2/22
(Continued)

(56) References Cited

U.S. PATENT DOCUMENTS 2,873,082 A * 2/1959 Gillespie ................. F16B 2/241
248/300
5,193,890 A * 3/1993 Robertson, Jr. ........ A47B 81/06
248/27.1
(Continued)

OTHER PUBLICATIONS

Eaton, Product Range Catalog. Connect Switchgear intelligently with SmartWire-DT® Operate Machines and Systems efficiently. 2012, 85 pages, Publication No. CA0506001Z-EN-INT Doku/DHW/ip 05/15, Article No. 153577, Printed in Germany, Eaton Corporation, www.eaton.eu/swd.
(Continued)

*Primary Examiner* — Christopher Garft
(74) *Attorney, Agent, or Firm* — Amin, Turocy & Watson, LLP

(57) ABSTRACT

A housing for an industrial sensor comprises integral U-shaped pockets configured to engage with attachment features of a complementary mounting bracket. The bracket comprises an overhang feature on a second end and a snap feature on an opposing first end. The housing can be mounted to the bracket by inserting a mounting boss formed within one of the U-shaped pockets underneath the overhang feature of the bracket, and pressing the housing against the bracket to cause the snap feature to engage with another mounting boss formed in the other U-shaped pocket. These mounting features allow the housing to be mounted easily and quickly without the use for additional tools. The housing can also be quickly removed from the bracket by pressing an extended tab near the snap feature to facilitate disengagement of the housing from the bracket.

12 Claims, 22 Drawing Sheets

(58) Field of Classification Search
USPC ..... 248/674, 309.1, 316.8, 310, 500, 222.11, 248/222.12, 346.03–346.04, 27.1, 300; 455/575.1; 312/245, 7.1
See application file for complete search history.

(56) References Cited

U.S. PATENT DOCUMENTS

| | | | |
|---|---|---|---|
| D461,779 S | 8/2002 | Hughes | |
| D462,059 S | 8/2002 | Hughes | |
| D462,328 S | 9/2002 | Hughes | |
| 6,592,087 B2* | 7/2003 | Pitault | G01D 11/245 248/201 |
| 6,839,239 B1* | 1/2005 | Lee | H05K 5/0286 206/308 |
| D545,765 S | 7/2007 | Cockburn | |
| D549,663 S | 8/2007 | Tsou et al. | |
| D552,039 S | 10/2007 | Liao | |
| 8,455,831 B2* | 6/2013 | Santos | G01D 11/26 250/353 |
| D792,356 S | 7/2017 | Lin | |
| 2005/0250380 A1* | 11/2005 | Mahoney | H01R 9/16 439/569 |
| 2007/0001083 A1* | 1/2007 | Martin et al. | F16B 5/0241 248/674 |

OTHER PUBLICATIONS

Efector, IFM, AC2316 Dual Sensor T5 2SI 1DO T M12, May 12, 2011, 2 pages, IFM Ecefotr, Inc, Malvern PA.

Pilz, Passive junction—PDP67 F 4 code, Dec. 2009, 2 pages, Pilz GmbH & Co. KG, Germany, www.pilz.com.

Sick, Sensor Intelligence Flexi Classic Efficient Control to the End of the Line, May 8, 2015, 32 pages, 8011770, Sick AG, Germany, www.sick.com.

Eaton, SmartWire-DT Modules IP67 Manual, May 2015, 112 pages, MN012006ZEN, Eaton Industries GmbH, www.eaton.com.

Eaton, Connect Intelligently Increase Availability Cost Optimization, 2014, 24 pages, Article No. 118731, Eaton corporation, Printed in Germany.

Sick, Sensor Intelligence Flexi Loop Safe sensor cascade hardware Operating Manual, May 24, 2016, 104 pages, Sick AG, Germany, www.sick.com.

Office Action for U.S. Appl. No. 29/599,883 dated Dec. 29, 2017, 16 pages.

* cited by examiner

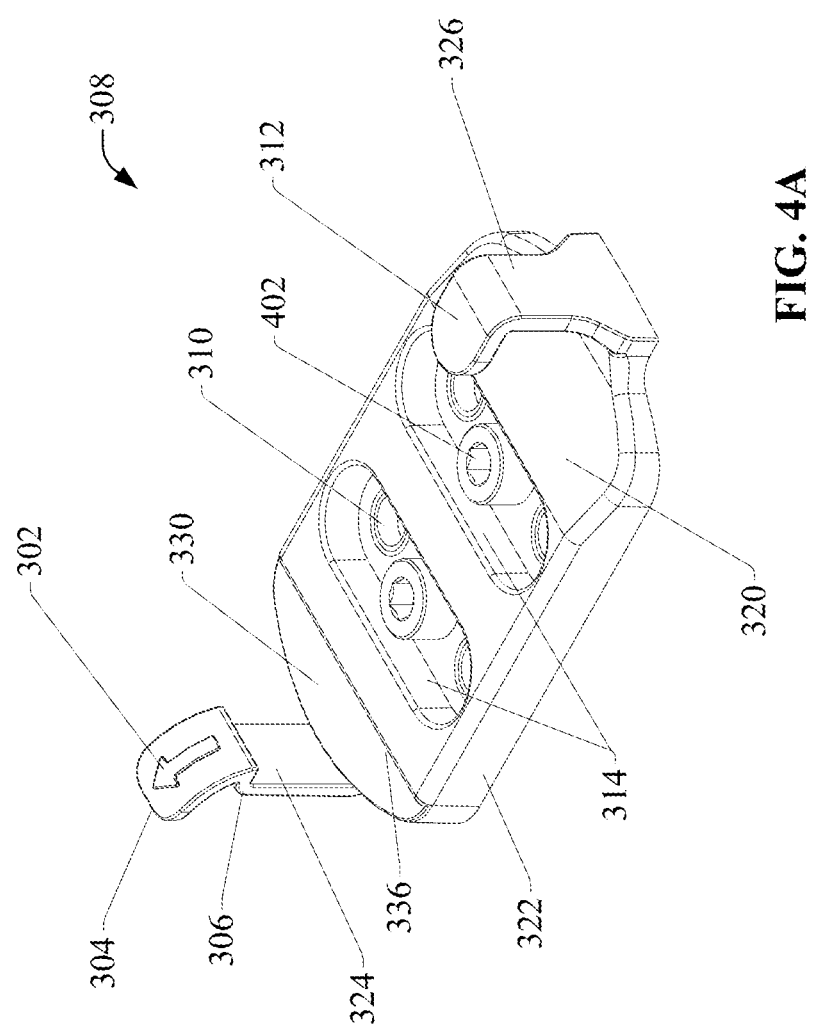

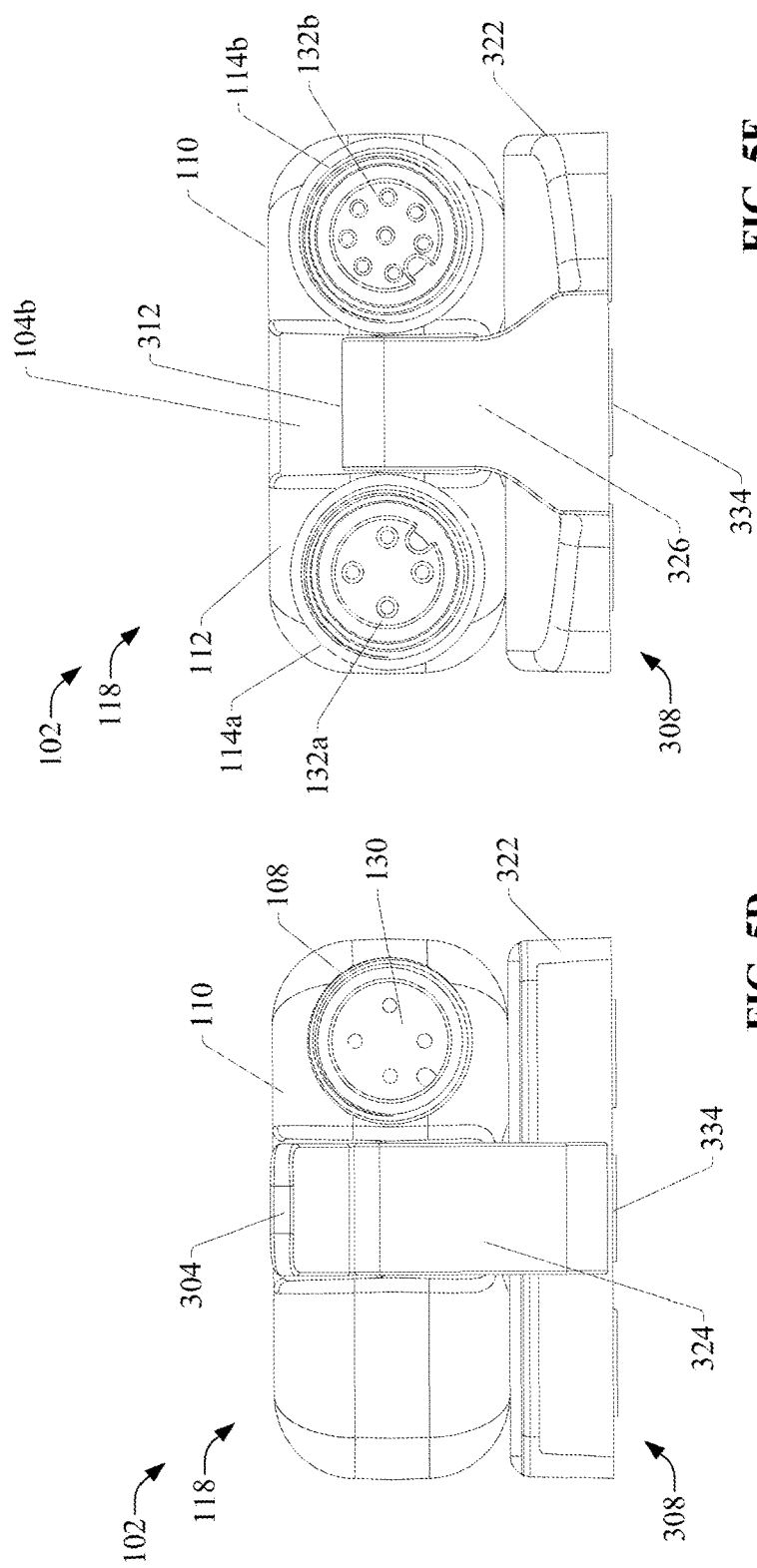

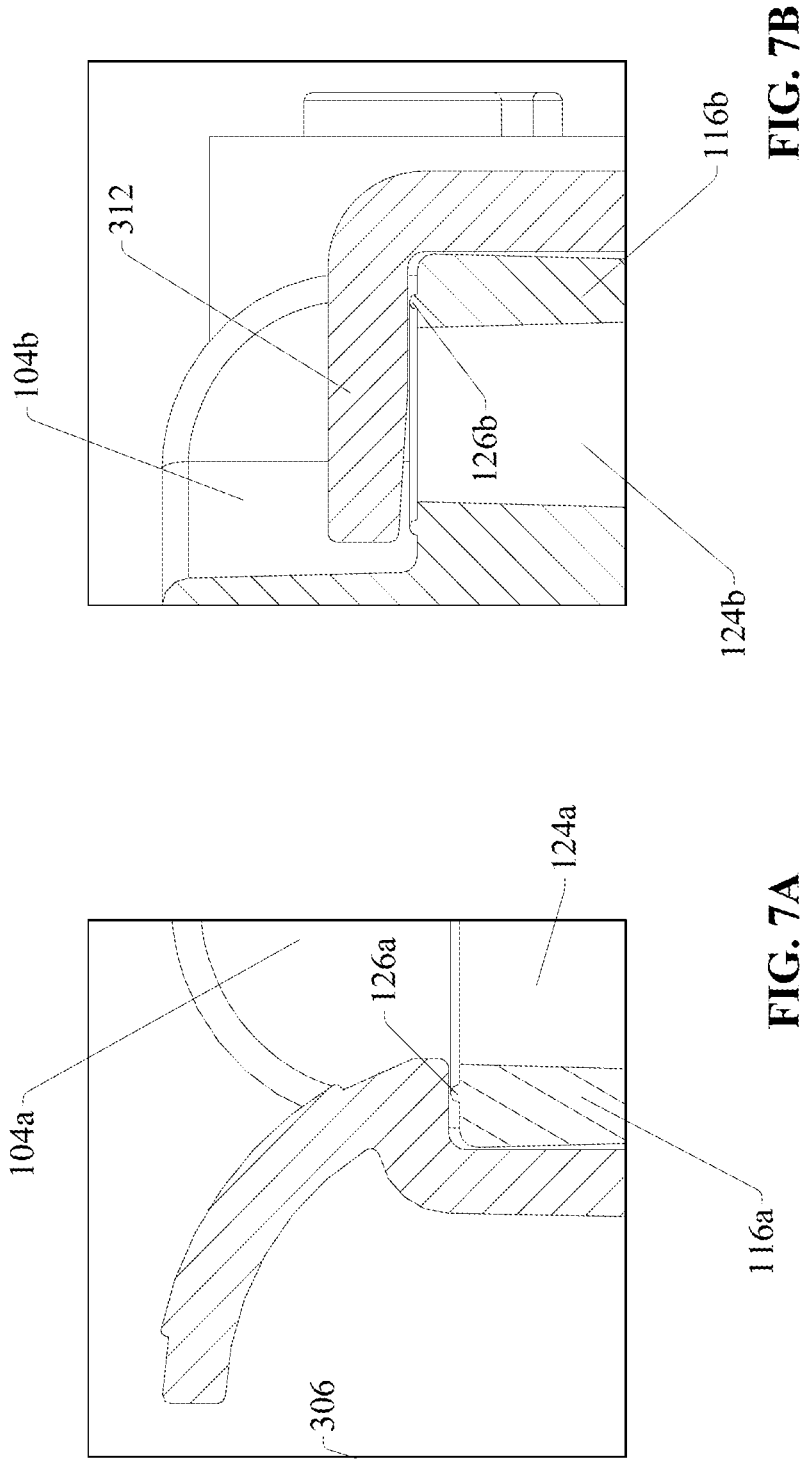

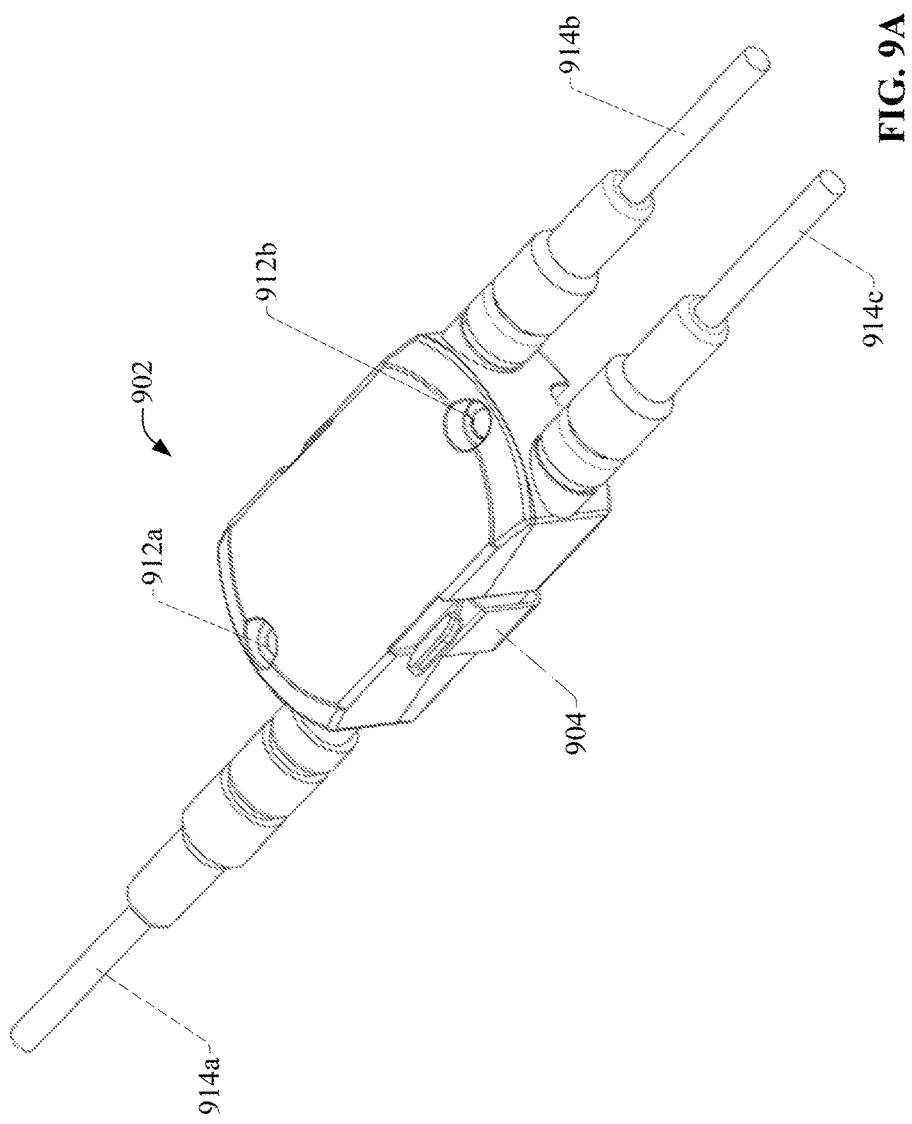

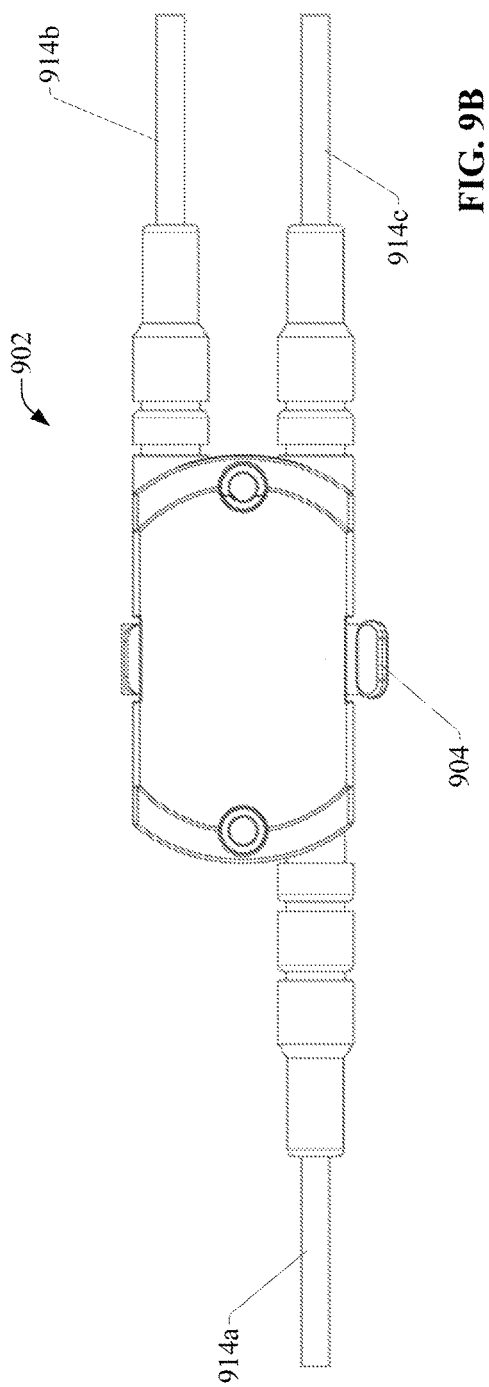

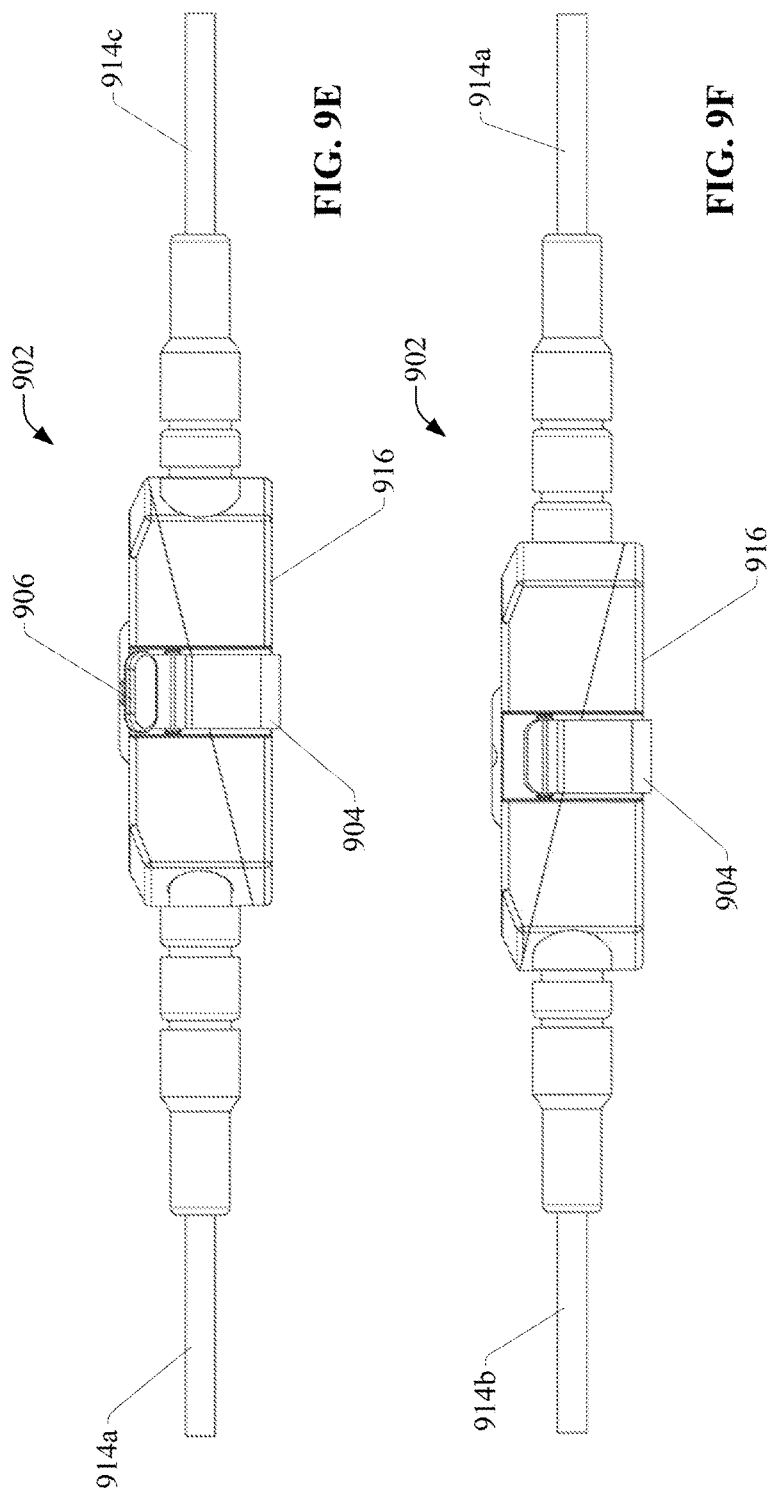

Н OUSING AND COMPLEMENTARY SNAP-FIT BRACKET

BACKGROUND

The subject matter disclosed herein relates generally to industrial sensors or other electronic devices, and, more particularly, to mounting of industrial sensors to a mounting surface.

BRIEF DESCRIPTION

The following presents a simplified summary in order to provide a basic understanding of some aspects described herein. This summary is not an extensive overview nor is it intended to identify key/critical elements or to delineate the scope of the various aspects described herein. Its sole purpose is to present some concepts in a simplified form as a prelude to the more detailed description that is presented later.

In one or more embodiments, a system for mounting an electronic component is provided, comprising a housing comprising a first pocket located at a first end of the housing; a first mounting boss located within the first pocket; a second pocket located at a second end of the housing; and a second mounting boss located within the second pocket.

A method for mounting a housing of an electronic device is also described, the method comprising inserting a second end of the housing under an overhang feature of a bracket, wherein the overhang feature is disposed on a second arm that extends from a second end of the bracket, and wherein the inserting the second end of the housing causes the overhang feature to engage with a second mounting boss located in a second pocket formed in the second end of the housing; and pressing a first end of the housing against the bracket while the overhang feature is engaged with the second mounting boss, wherein the pressing causes a snap feature of a first arm that extends from a first end of the bracket to engage with a first mounting boss located in a first pocket formed in the first end of the housing.

Also, an industrial sensor assembly is provided, comprising a sensor housing that houses components of an industrial sensor, the sensor housing comprising a first end and a second end opposite the first end, a first pocket and a second pocket formed in the first end and the second end, respectively, and a first mounting boss and a second mounting boss formed in the first pocket and the second pocket, respectively.

To the accomplishment of the foregoing and related ends, certain illustrative aspects are described herein in connection with the following description and the annexed drawings. These aspects are indicative of various ways which can be practiced, all of which are intended to be covered herein. Other advantages and novel features may become apparent from the following detailed description when considered in conjunction with the drawings.

BRIEF DESCRIPTION OF THE DRAWINGS

FIG. 4A is a three-dimensional view of a snap-fit bracket with bolts inserted through two mounting holes of the elongated pockets formed in the bracket.

FIG. 5D is a front view of a sensor housing mounted to a snap-fit bracket.

FIG. 5E is a rear view of a sensor housing mounted to a snap-fit bracket.

FIG. 7A is a detailed side view of the latching interaction between a snap feature of a bracket and a mounting boss of a sensor housing.

FIG. 7B is a detailed side view of the latching interaction between an overhang feature of a bracket and a mounting boss of a housing.

FIG. 9A is an orthographic view of a housing and bracket having another alternative design.

FIG. 9B is a top view of the housing and bracket having the other alternative design.

FIG. 9E is a left side view of the housing and bracket having the other alternative design.

FIG. 9F is a right side view of the housing and bracket having the other alternative design.

DETAILED DESCRIPTION

Figure 1A:
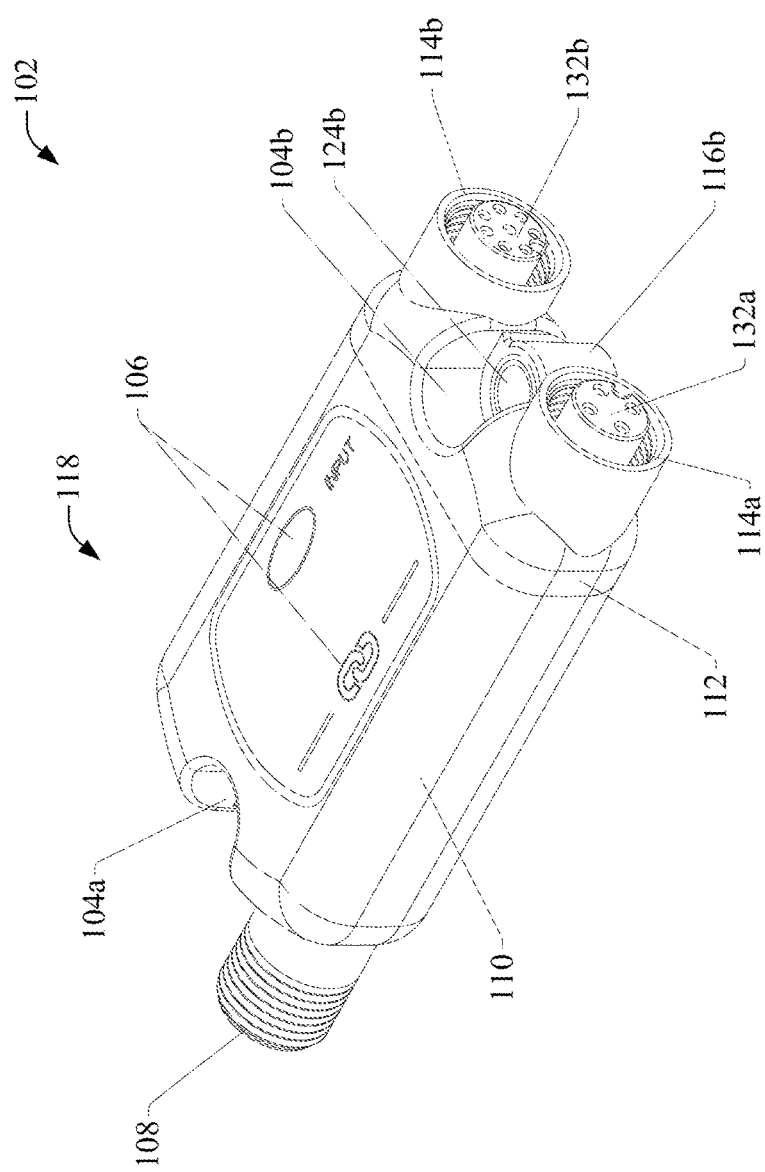
FIG. 1A is a three-dimensional view of a sensing device enclosed in a housing.

The subject disclosure is now described with reference to the drawings, wherein like reference numerals are used to refer to like elements throughout. In the following description, for purposes of explanation, numerous specific details are set forth in order to provide a thorough understanding thereof. It may be evident, however, that the subject disclosure can be practiced without these specific details. In other instances, well-known structures and devices are shown in block diagram form in order to facilitate a description thereof.

In addition, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Various aspects or features will be presented in terms of systems that may include a number of devices, components, modules, and the like. It is to be understood and appreciated that the various systems may include additional devices, components, modules, etc. and/or may not include all of the devices, components, modules etc. discussed in connection with the figures. A combination of these approaches also can be used.

Many industrial automation systems include one or more types of sensors that provide digital or analog inputs to industrial controllers, safety controllers, or other supervisory devices. Such sensors include, but are not limited to, photoelectric sensors that use optical beams to detect the presence of a person or object, inductive proximity sensors that detect the presence of metal objects, safety sensors that provide safety inputs to a safety controller associated with a hazardous industrial area, and other such sensors.

There is a need across multiple industries for the ability to quickly install and uninstall such sensing devices. Installation of sensing devices can consume a substantial amount of time, particularly when complex multi-part brackets are used to affix the housing of the sensing device to a mounting surface. Similarly, when a sensing device becomes faulty and needs to be replaced, disassembling a complex mounting bracket so that the faulty sensing device can be removed and replaced with a new sensing device can be a time-consuming process. The time invested in replacing faulty sensors is compounded when multiple sensing devices need to be replaced. Also, in some cases, a production line must be shut down for safety reasons while a sensing device is being installed or replaced. Thus, the more time that is required to install or replace an industrial sensor, the greater the cost in lost productivity and revenue. When production downtime associated with sensor installation and replacement is compounded over multiple sensors, the cost of lost production can extend into the thousands or tens of thousands of dollars per minute.

Moreover, many multipart clamping-style brackets that are often used to mount sensing devices are made up of many interlocking components, which can be easily lost when the bracket is disassembled during mounting or removal of a sensing device.

To address these and other issues, one or more embodiments described herein provide a housing and snap-fit bracket with complementary mating features. In one or more embodiments, a bracket with an integral snap feature and overhang feature is attached to a mounting surface with mounting screws or other mounting hardware. A housing has integral U-shaped pockets located on respective two ends of the housing. The pockets are concentric with mounting bosses in which integral mounting holes are formed. The housing can be inserted at an angle under the overhang feature of the bracket and pressed downward to engage the snap feature of the bracket. The snap feature and overhang feature fit over the outer diameters of the respective two mounting bosses, and engage with the complementary pockets that are integral to the housing, thereby retaining the housing along at least three axes (the X, Y, and Z axes) simultaneously.

The interaction between the housing pockets and the snap-fit bracket described herein provide a simple, rugged, and reliable fixation of the housing along at least three dimensions (the X, Y, and Z axes). The design yields a small footprint and low size profile, rendering the housing and bracket assembly suitable for use in small or constricted spaces. The design also allows the housing to be assembled to and disassembled from the bracket without the need for additional tools. In some embodiments, the housing can include mounting holes for screws as well as pockets for interaction with the snap-fit bracket, providing two optional mounting methods—an option for mounting using the bracket, and an option for mounting directly to a mounting surface without the bracket. The symmetric housing pockets allow the housing to be installed on the bracket in either of two orientations rotated 180 degrees from one another. Moreover, the bracket comprises a single part with no additional components to disassemble.

Although the housing and snap-fit bracket are described herein as being used to mount industrial sensors, the housing, bracket, and associated mounting techniques described herein are not limited to such sensors, but rather are suitable for use with substantially any type of electronic device.

Figure 1B:
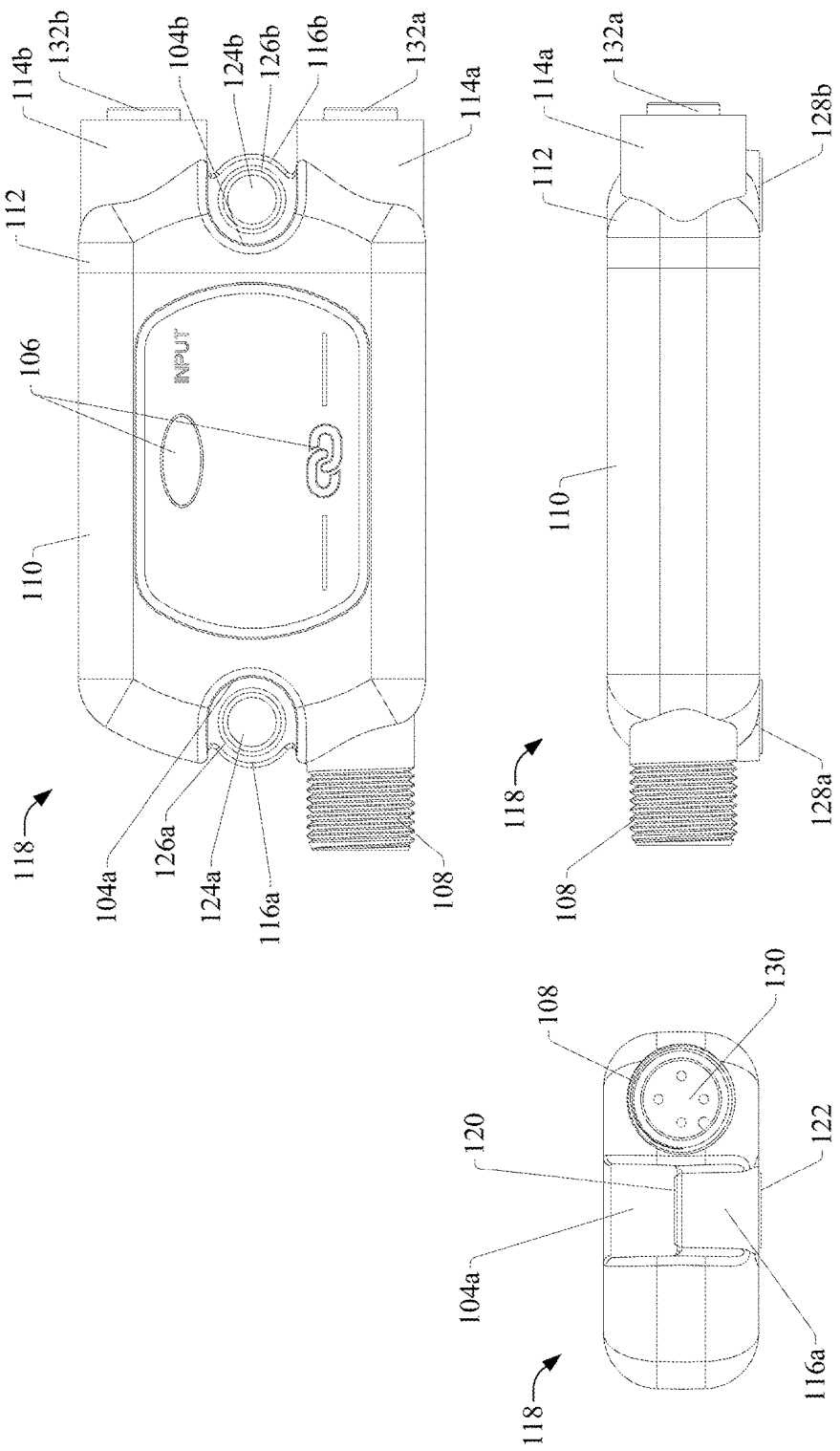
FIG. 1B is an orthographic view of a sensing device enclosed in a housing.

FIG. 1A is a three-dimensional view of a sensor 102 enclosed in a housing 118 according to one or more embodiments. FIG. 1B is an orthographic view of the sensor 102. In the illustrated embodiment, the housing 118 comprises a main housing 110 and an end cap 112 mated to the main housing 110. The main housing comprises a hollow body within which most or all of the sensing components reside. The end of the main housing 110 to which end cap 112 mates is open, allowing the sensing components to be installed in the main housing 110 through the opening in the main housing 110. Once the sensing components are installed in the main housing 110, the end cap 112 can be mounted over the open end of the main housing 110, thereby enclosing the sensing components within the assembled housing 118. The end cap 112 can be mated to the main housing 110 using any suitable mounting technique, including but not limited to adhesive bonding, press fit techniques, fasteners, snap fit techniques, etc. The main housing 110 and end cap 112 can be made of any suitable material, such as a thermoplastic material. Suitable thermoplastic materials include, but are not limited to, acrylonitrile butadiene styrene (ABS), polybutylene terephthalate (PBT), nylon, liquid crystal polymer (LCP), or other suitable polymeric material.

It is to be appreciated that the housing assembly comprising the main housing 110 and end cap 112 are only intended to be exemplary, and that mounting features described herein are not limited to housings that conform to this example architecture. For example, the mounting features to be described in more detail below can be implemented on a housing whose body is continuously formed, without a removable end cap 112, and that allows installation of sensor components via a lid or door on a top surface of the housing.

In the example sensor illustrated in FIGS. 1A and 1B, an M12 male threaded connector 108 is located at one end of the housing 118, protruding from the housing 118. A data or power port 130 of the sensor resides within the male threaded connector 108 facing outward. One or more female threaded connectors 114a and 114b are located on the end cap 112 (opposite male threaded connector 108), protruding from the housing 118 in an opposite direction relative to male threaded connector 108. Additional data or power ports 132a and 132b of the sensor reside within the female threaded connectors 114a and 114b. The data or power ports 130, 132a, and 132b are configured to interface with respective data and/or power cables that couple to the threaded connectors 108, 114a, and 114b, thereby interfacing the sensor components with a power source, a data bus, and/or an external device. While only three connectors are depicted in FIGS. 1A and 1B, the mounting features described herein are not limited by the number of connectors used by the enclosed sensor. Moreover, although the illustrated embodiments depict the connectors 108, 114a, and 114b as extending from the same ends of the housing as those containing the pockets 104a and 104b (i.e., the short sides), the mounting features described herein are not limited to such a configuration of connectors. For example, in some embodiments connectors may extend from one or both of the long sides of housing 118 instead of or in addition to the short sides.

LED indicators 106 located on a top surface of the housing 118 are configured to convey status indications for the sensor (e.g., "power on," "fault," "object detected," etc.).

The housing 118—comprising the assembled main housing 110 and end cap 112 in the illustrated example—has formed therein U-shaped pockets 104a and 104b at respective ends end of the housing 118. In the illustrated example, a first pocket 104a is formed at the non-open end of the main housing 110 (opposite the end to which the end cap 112 is mounted), and a second pocket 104b is formed in the end cap 112 symmetrically with the first pocket 104a. Each pocket 104a and 104b is substantially centered along a width of the housing 118; that is, the pockets 104a and 104b are substantially aligned with a lengthwise centerline of the housing 118. On the end cap 112, the pocket 104b is located substantially symmetrically between connectors 114a and 114b.

Mounting bosses 116a and 116b are formed within each U-shaped pocket 104a and 104b, respectively. Each mounting boss 116a and 116b has a height that extends approximately half-way through its respective pocket 104a or 104b. That is, each mounting boss 116a and 116b has a top surface 120 that begins approximately half way down the length of its respective pocket 104a and 104b, and a bottom surface 122 that is substantially flush with the bottom surface of the housing 118. Each mounting boss 116a and 116b has a mounting hole 124a and 124b passing through the boss for receiving a screw, bolt, or other mounting hardware. Mounting holes 124a and 124b extend from the top surface 120 to the bottom surface 122 of the respective bosses 116a and 116b, extending substantially vertically (or substantially parallel to the short side walls of the housing 118). Annular crush rings 126a and 126b are located on the top surfaces 120 of the mounting bosses 116a and 116b concentric with the mounting hole 124a and 124b. Raised pads 128a and 128b are located on the bottom surface 122 of the respective mounting bosses 116a and 116b concentric with the mounting hole 124a and 124b. The sensor mounting features described herein utilize the symmetry between the U-shaped pockets 104a and 104b and their associated integral mounting bosses 116a and 116b.

Figure 2A:
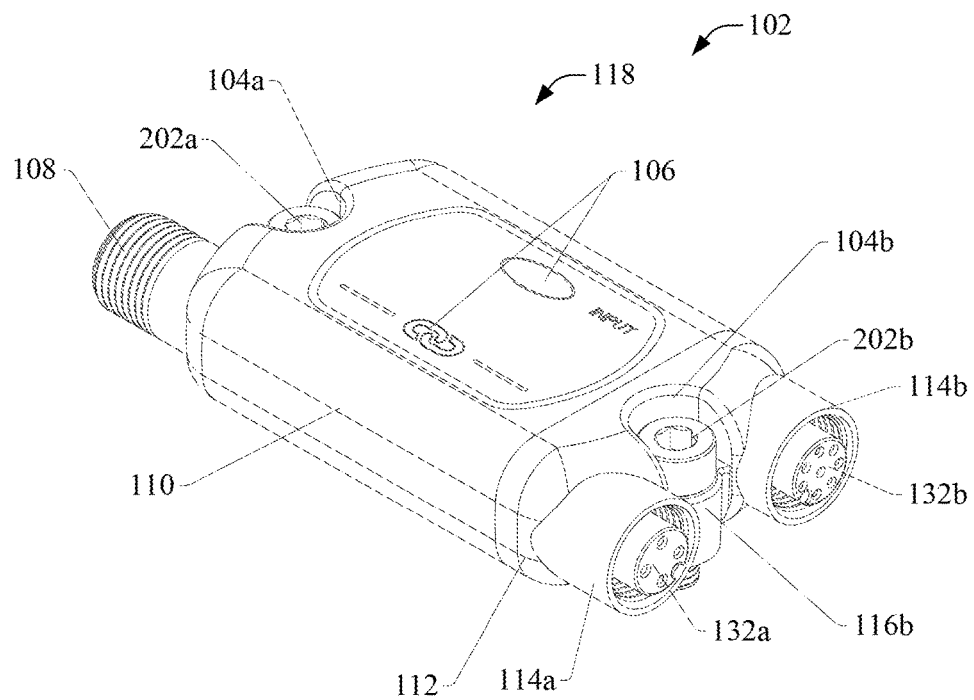
FIG. 2A is a three-dimensional view of sensor comprising a housing with bolts inserted through mounting holes of the housing.
Figure 2B:
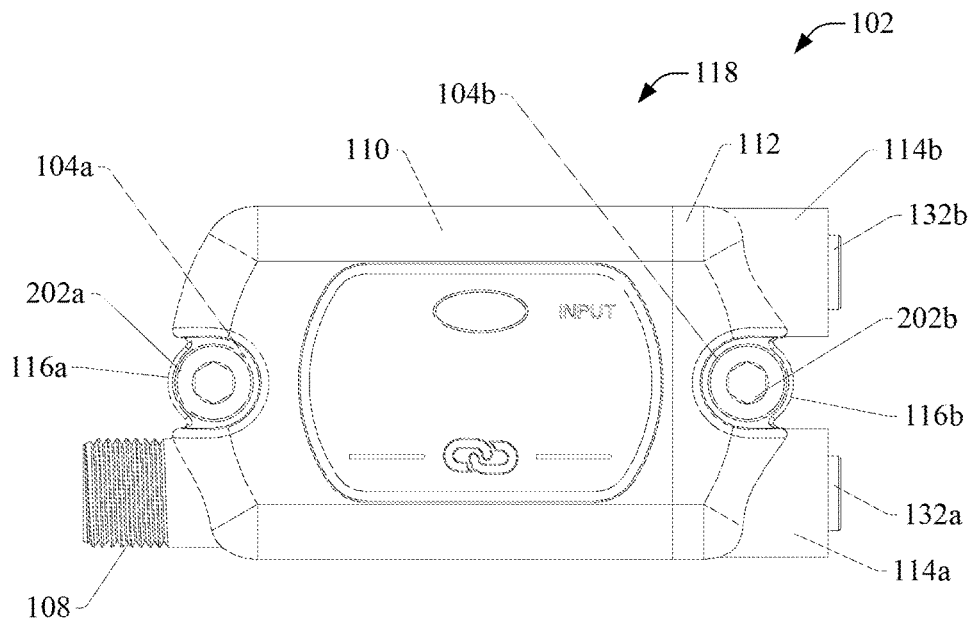
FIG. 2B is a top view of a sensor housing showing bolts inserted through the mounting holes.

FIG. 2A is a three-dimensional view of sensor 102 comprising housing 118 with bolts 202a and 202b inserted through the mounting holes 124a and 124b. FIG. 2B is a top view of the sensor 102 and housing 118 showing the bolts 202a and 202b. The mounting holes 124a and 124b in the housing 118 provide a first means of mounting, whereby the sensor 102 can be mounted directly to a mounting surface using screws or bolts 202a and 202b inserted through the mounting holes 124a and 124b.

Figure 2C:
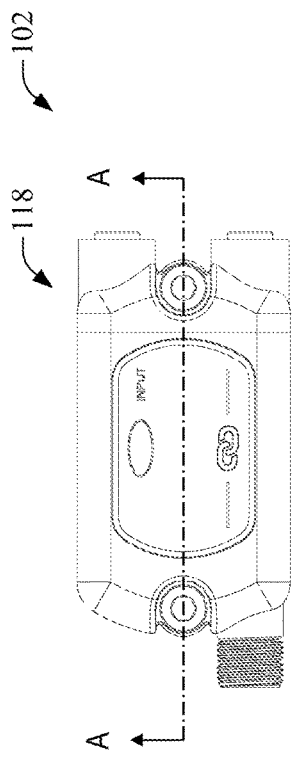
FIG. 2C is a top view of a sensor housing.
Figure 2D:
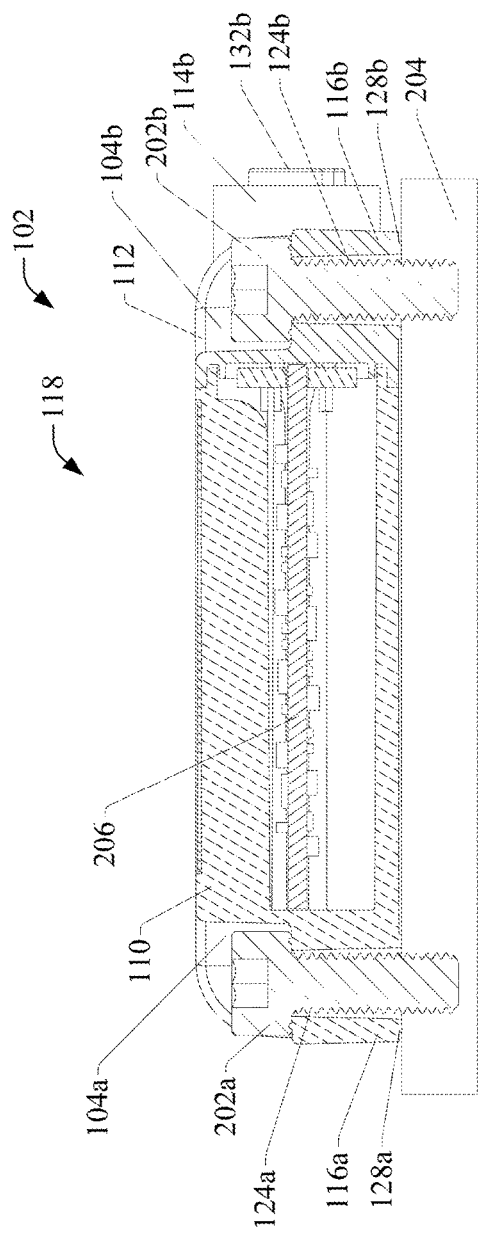
FIG. 2D is a cross-sectional side view of a sensor mounted directly to a mounting surface using bolts or screws.

FIG. 2C is a top view of sensor 102 with housing 118, and FIG. 2D is a cross-sectional side view through cutting plane A-A on the sensor 102 shown in FIG. 2C. In accordance with the first means for mounting the sensor 102, the housing 118 is secured to a mounting surface 204 via screws or bolts 202a and 202b inserted through the mounting holes 124a and 124b. The annular crush rings 216a and 126b (not visible in FIG. 2D) deform when the screws or bolts 202a and 202b are tightened to concentrate the applied stress and prevent the screws or bolts 202a and 202b from rupturing the outer walls of the mounting bosses 116a and 116b. The raised pads 128a and 128b on the bottom of the respective mounting bosses 116a and 116b provide a flat mounting surface for the sensor 102 even if the housing 118 is warped or bowed.

A printed circuit board (PCB) 206 on which the sensor's electronic components are mounted is installed within the housing 118. As noted above, the embodiment illustrated in FIGS. 1A, 1B, and 2A-2D allow the PCB 206 to be inserted through the open end of the main housing 110 while the end cap 112 is removed from the main housing 110. Once the PCB 206 is installed in the main housing 110, the end cap 112 can be mounted over the open end of the main housing 110, thereby enclosing the PCB 206 within the assembled housing 118. The sensor's power and/or data ports are exposed via the hollow male threaded connector 108 and female threaded connectors 114a and 114b.

Figure 3A:
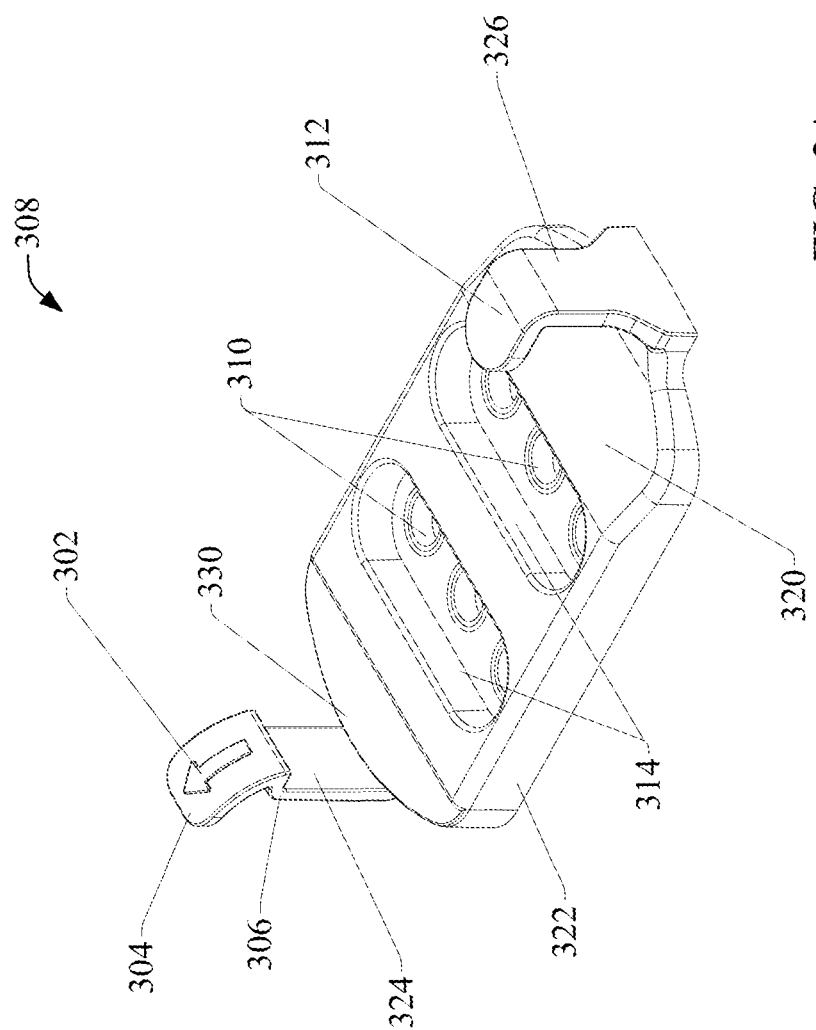
FIG. 3A is a three-dimensional view of a snap-fit bracket that can be used to mount a sensor housing.
Figure 3B:
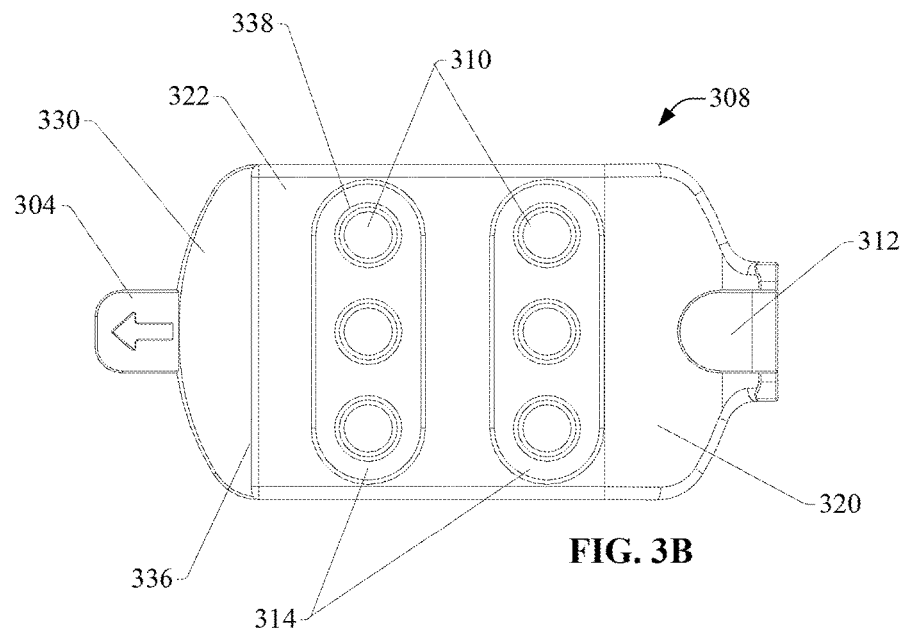
FIG. 3B is a top view of a snap-fit bracket.
Figure 3C:
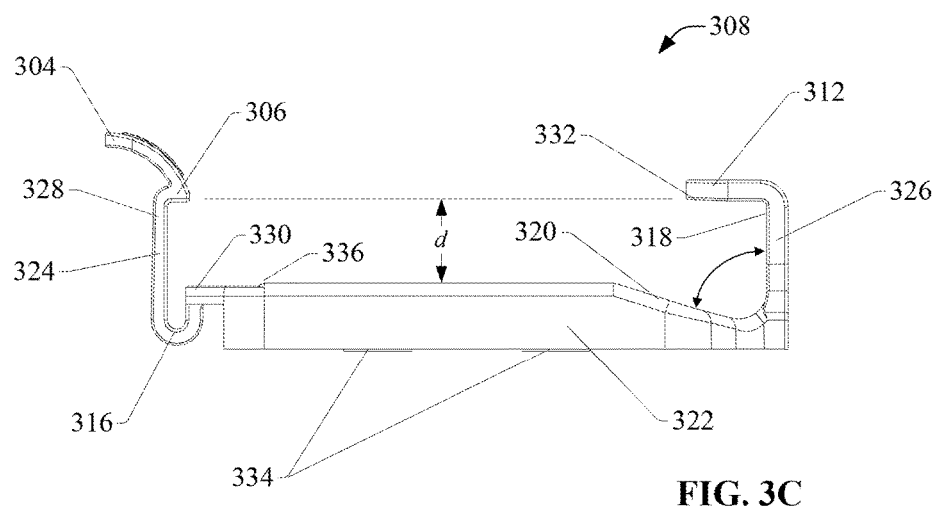
FIG. 3C is a side view of a snap-fit bracket.

FIG. 3A is a three-dimensional view of a snap-fit bracket 308 that can be used to mount housing 118. FIGS. 3B and 3C are top and side views, respectively, of snap-fit bracket 308. Snap-fit bracket 308 comprises a main bracket body 322, a first arm 324 extending from a first end of the main bracket body 322, and a second arm 326 extending from a second end of the main bracket body 322 opposite the first end. The first arm 324 and second arm 326 extend from the respective ends of main bracket body 322 in the same direction, substantially perpendicular to the plane of the top surface of the main bracket body 322. The first arm 324 includes a snap feature 306 comprising a substantially 90-degree bend located partway along the length of the first arm 324. The substantially 90-degree bend of the snap feature 306 is directed inward to face the second arm 326, forming an overhanging lip positioned above the edge of the main bracket body 322.

In some embodiments, a section 328 of the first arm 324 just below the snap feature 306 can be tapered, such that the tapered section is wider toward the base of the first arm 324 and narrower toward the snap feature 306. Tapering the first arm 324 near the snap feature 306 can increase the flexibility of the first arm 324 near the snap feature 306. Moreover, in some embodiments, the base of the first arm 324 can comprise a U-shaped bend 316, whereby one leg of the U-shaped bend 316 is continuous with the main portion of the first arm 324 and the other leg of the U-shaped bend 316 is a shorter section that attaches to the bottom surface of a ledge 330 that extends from the first end of the main bracket body 322. This U-shaped bend 316 can increase the overall flexibility of the first arm 324, allowing the first arm 324 to flex away from the bracket 308 as the housing 118 is being installed.

The end of the first arm 324 opposite the end on which the U-shaped bend 316 is formed comprises an extended tab 304 that curves backward (away from the main bracket body 322) from the snap feature 306. The extended tab 304 can be pressed by the user in order to disengage the housing 118 from the bracket 308, as will be described in more detail below. In some embodiments, an arrow 302 or other marking can be printed or embossed on the extended tab 304 to indicate a direction in which to move the extended tab 304 in order to disengage the snap feature 306 from the sensor housing 118.

The second arm 326 is bent or curved substantially 90 degrees inward (toward the bracket 308) to form an overhang feature 312 located opposite the snap feature 306 and facing the snap feature 306 from the second end of the main bracket body 322. The overhang feature 312 is directed inward (toward the opposite end of the main bracket body 322) such that the snap feature 306 and the overhang feature 312 face one another from the opposite ends of the main bracket body 322. The respective bottom surfaces of the snap feature 306 and the overhang feature 312 (that is, the surfaces that face the main bracket body 322) are positioned relative to the main bracket body 322 such that both bottom surfaces are offset from the plane of the top surface of the main bracket body 322 by a substantially same distance d, where the distance d substantially corresponds to the height of the mounting bosses 116a and 116b on the sensor housing 118.

The overhang feature 312 has a uniform thickness and a rounded end (see FIG. 3B) that corresponds to the shape of the U-shaped pockets 104a and 104b on the sensor housing 118. In some embodiments, the front edge portion 332 of the underside of the overhang feature 312 can have a slight upward angle (e.g., a four-degree angle) or incline relative to the horizontal. This slight angle can facilitate installation of the sensor housing 118 into the bracket 308 by allowing the corresponding mounting boss 116b to be more easily inserted under the overhang feature 312. Likewise, the top surface of the main bracket body 322 can have a downwardly angled portion 320 near the second arm 326. The angled portion 320 slopes downward toward the base of the second arm 326 such that the angled portion 320 forms an angle (e.g., a 72 degree angle) with the vertical section 318 of the second arm 326. This angle can also facilitate installation of the sensor housing into the bracket 308.

A step 336 on the top surface of the main bracket body 322 located near the first arm 324 provides a relief space for the raised pads 128a on the bottom of the sensor housing 118. The step 336 extends across the main bracket body 322 between the two long sides of the main bracket body 322.

Two laterally elongated pockets 314 are formed on the top surface of the main bracket body 322 (although only two pockets 314 are depicted, some embodiments may have more or fewer than two pockets). The two elongated pockets 314 are substantially parallel and extend between the two side edges of the main bracket body 322. The pockets 314 have a depth that is less than a thickness of the main bracket body 322. Integral mounting holes 310 are located at the bottom of each of the pockets 314, extending from the floor of the pockets 314 down through the bottom surface of the main bracket body 322. Holes 310 are configured to receive a screw or bolt to facilitate mounting the bracket 308 to a mounting surface. An annular crush ring 338 is located around the top surface of each mounting hole 310. A raised pad 334 is located around the bottom surface of each mounting hole 310.

The bracket 308 can be made of any suitable material, such as a thermoplastic material. Suitable thermoplastic materials for the bracket can include, but are not limited to, acrylonitrile butadiene styrene (ABS), polybutylene terephthalate (PBT), polyetherimide (PEI), polycarbonate (PC), nylon, acetal, polyphenylsulfone (PPSU), or other suitable polymeric materials.

Figure 4B:
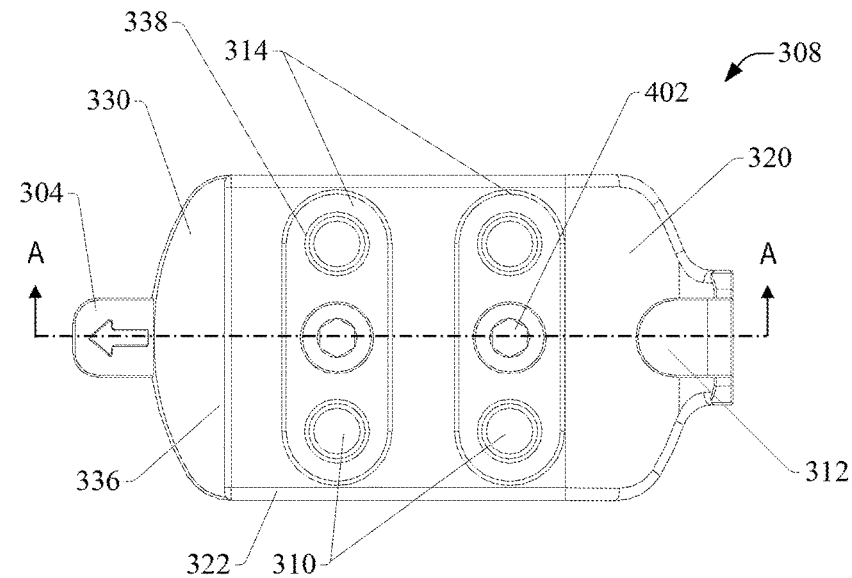
FIG. 4B is a top view of a snap-fit bracket with bolts inserted through two mounting holes of the elongated pockets formed in the bracket.
Figure 4C:
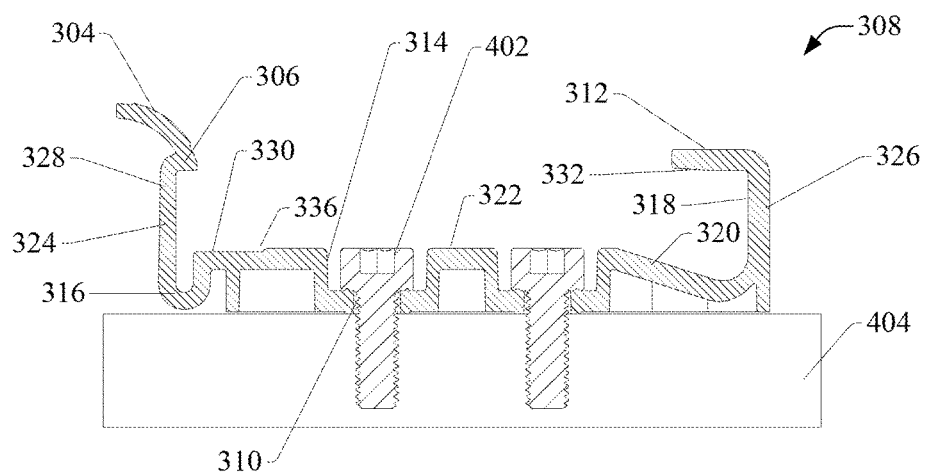
FIG. 4C is a cross-sectional side-view of a snap-fit bracket mounted directly to a mounting surface with bolts inserted through two mounting holes of the elongated pockets formed in the bracket.

FIG. 4A is a three-dimensional view of bracket 308 with bolts 402 inserted through two of the mounting holes 310 of the elongated pockets 314. FIG. 4B is a top view the bracket 308, and FIG. 4C is a cross-sectional side view of bracket 308 with the bolts 402 inserted. The mounting holes 310 provide a means for mounting the bracket 308 to a mounting surface 404. The bracket 308 can be mounted directly to the mounting surface 404 using screws or bolts 402 inserted through one or more of the mounting holes 310 and screwed into the mounting surface 404. The annular crush rings 338 deform when the screws or bolts 402 are tightened to concentrate the stress applied by the screws or bolts 402 and prevent the screws or bolts 402 from rupturing the outer wall of the bracket 308. The raised pads 334 under the bracket 308 provide for a flat mounting surface even if the bracket 308 is warped or bowed.

Figure 5A:
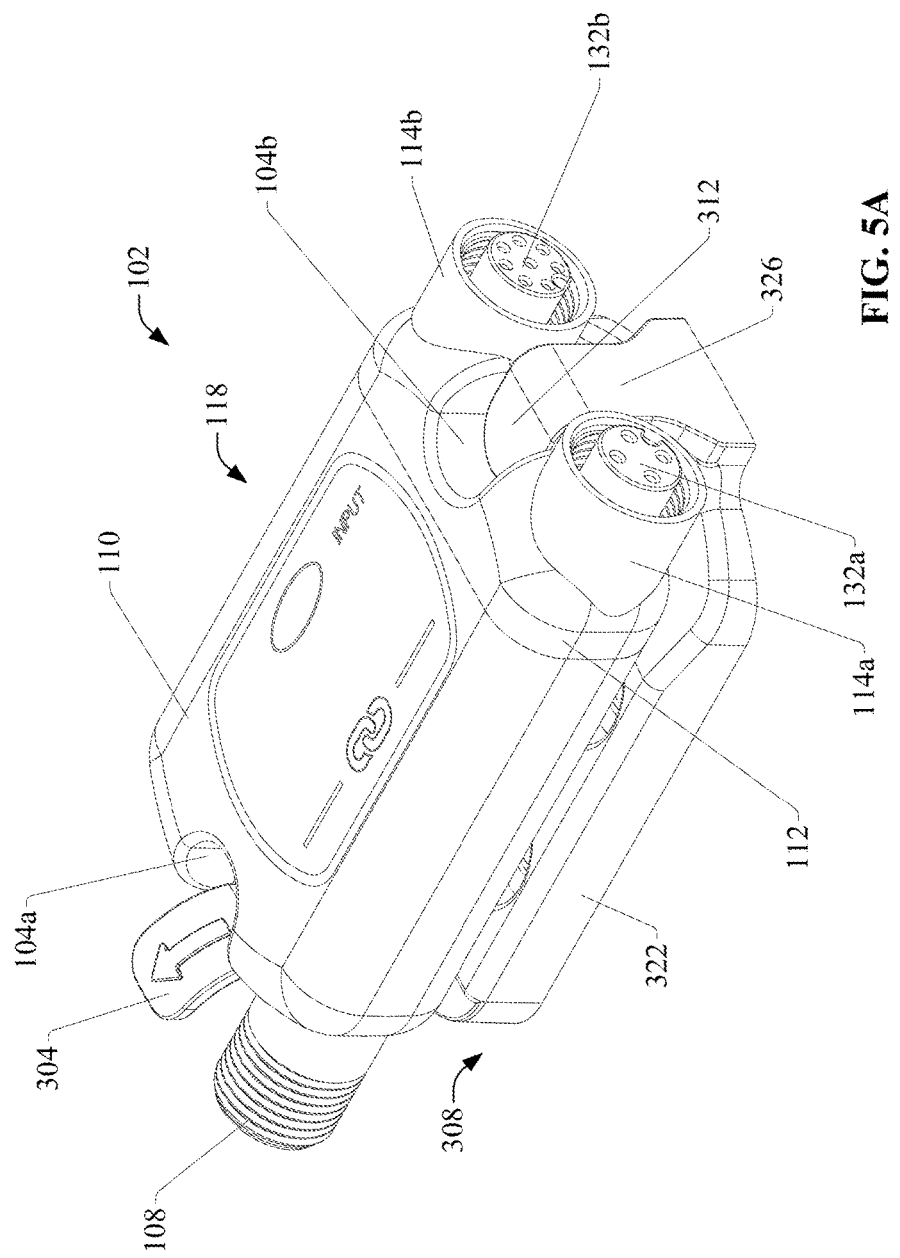
FIG. 5A is a three-dimensional view of a sensor housing mounted to a snap-fit bracket.

FIG. 5A is a three-dimensional view of sensor housing 118 mounted to bracket 308. FIGS. 5B, 5C, 5D, and 5E are a top view, a side view, a front view, and a rear view, respectively, of the sensor housing 118 mounted to bracket 308. The bracket 308 provides a second means of mounting the sensor housing 118, whereby the bracket 308 can be mounted to a mounting surface, and the sensor housing 118 can be attached to the bracket 308 via the snap feature 306 and overhang feature 312. The snap feature 306 and overhang feature 312 engage with the complementary U-shaped pockets 104a and 104b, respectively, and their associated mounting bosses 116a and 116b to thereby fix the housing 118 (and sensor 102) along at least three dimensions (the X, Y, and Z axes) simultaneously. Mounting the housing 118 to the bracket 308 also secures the sensor 102 against environmental effects such as shock and vibration.

Figure 5B:
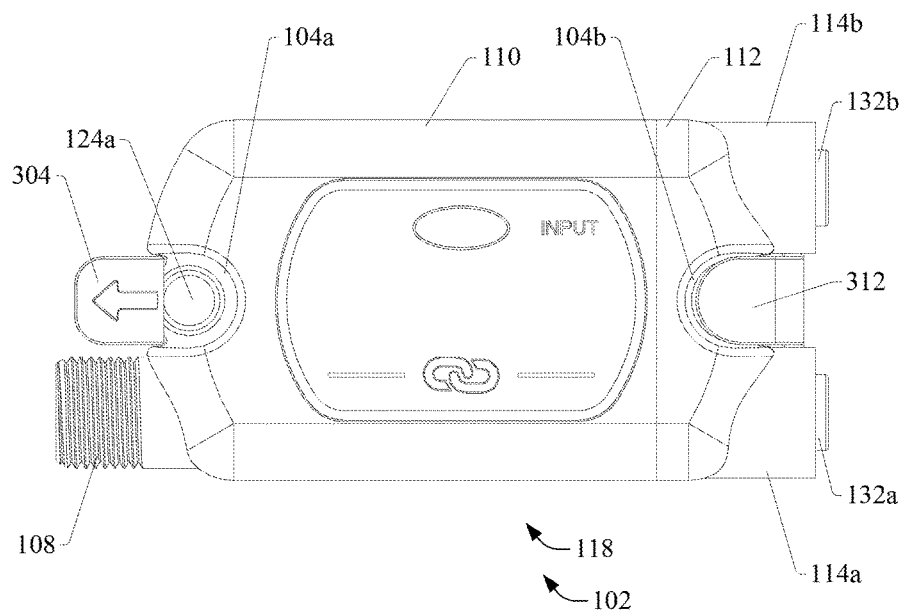
FIG. 5B is a top view of a sensor housing mounted to a snap-fit bracket.
Figure 5C:
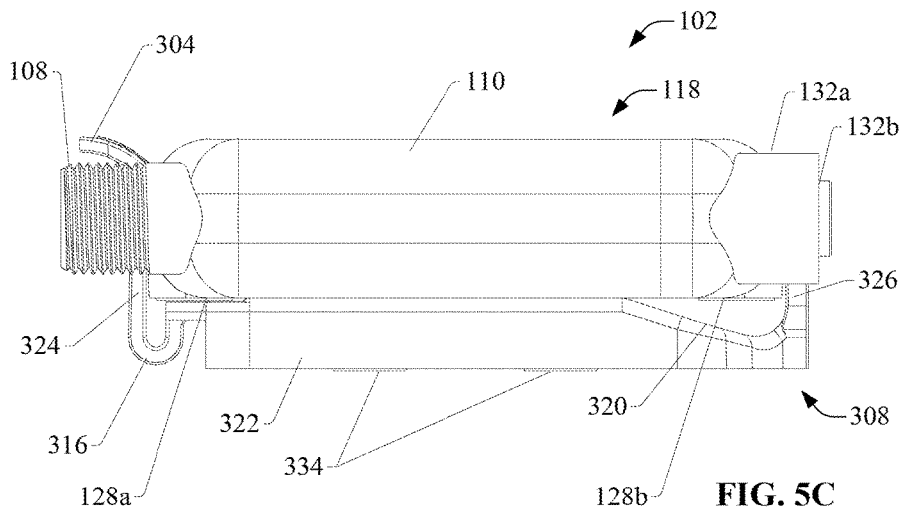
FIG. 5C is a side view of a sensor housing mounted to a snap-fit bracket.

The widths of the snap feature 306 and overhang feature 312 correspond to the widths of the U-shaped pockets 104a and 104b in the housing 118. The symmetric design of the housing pockets 104a and 104b allows the sensor 102 (enclosed in housing 118) to be installed on the bracket 308 such that the raised pads 128a and 128b on the bottom of the housing 118 are disposed within the clearance areas of the bracket 308 provided by the step 336 and the angled portion 320. As can be seen in FIGS. 5C and 5D, the top edge of the extended tab 304 on the first arm 324 of the bracket 308 is flush, or approximately flush, with the top surface of the housing. In this manner, the snap feature 306 on the first arm 324 is less likely to be inadvertently disengaged when the housing 118 is brushed by a hand or object. As can be seen in FIG. 5B, the overhang feature 312 is rounded to conform to the shape of U-shaped pocket 104b in the housing 118. As can be seen in FIGS. 5D and 5E, the widths of the first arm 324 and the second arm 326 generally correspond to the widths of the U-shaped pockets 104a and 104b. The widths of the first arm 324 and the second arm 326 can be made only slightly smaller than the widths of the U-shaped pockets 104a and 104b to allow the snap feature 306 and overhang feature 312 to fit within the U-shaped pockets 104a and 104b while preventing excessive movement of the housing 118 while mounted to the bracket 308 due to excessive clearance.

The process for mounting the sensor housing 118 onto bracket 308 is now described with reference to FIGS. 6A-6H. FIGS. 6A, 6C, 6E, and 6G are exterior side views of the housing 118 and bracket 308 depicting consecutive steps for installing the housing 118 into the bracket 308. FIGS. 6B, 6D, 6F, and 6H are cross-sectional views of housing 118 and bracket 308 corresponding to the exterior side views of FIGS. 6A, 6C, 6E, and 6G. In a first step depicted in FIGS. 6A and 6B, housing 118 with integral pockets 104a and 104b is oriented such that the housing 118 approaches the overhang feature 312 of the bracket 308 at a downward angle. The housing 118 is oriented relative to bracket 308 such that one of the mounting bosses 116b faces the overhang feature 312.

Figure 6A:
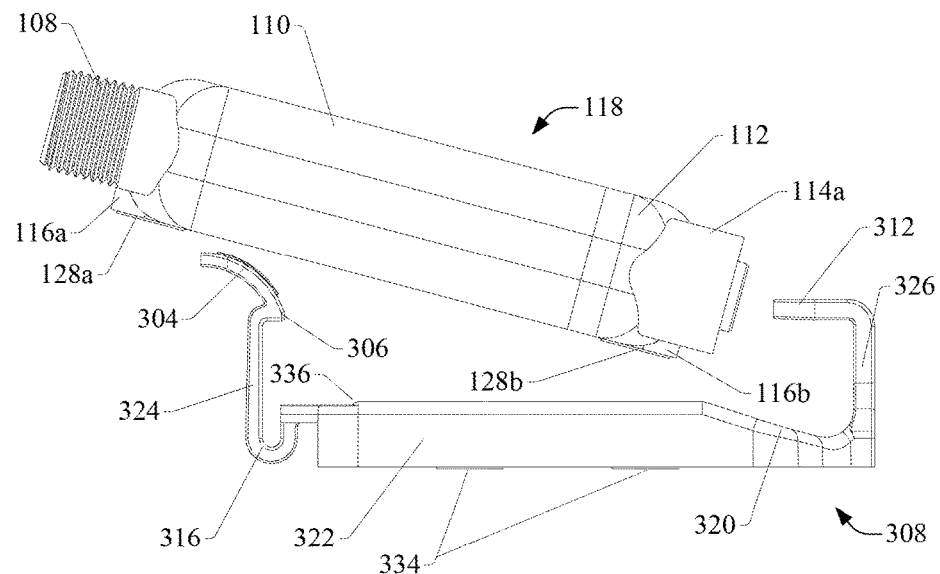
FIG. 6A is an exterior side view of a sensor housing and snap-fit bracket depicting a first step for mounting the housing to the bracket.
Figure 6B:
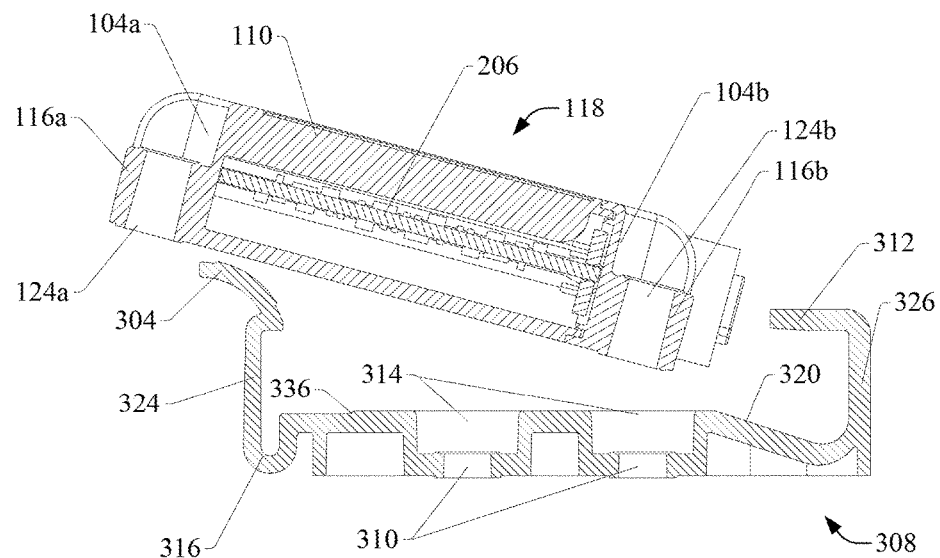
FIG. 6B is a cross-sectional side view of a sensor housing and snap-fit bracket depicting a first step for mounting the housing to the bracket.
Figure 6C:
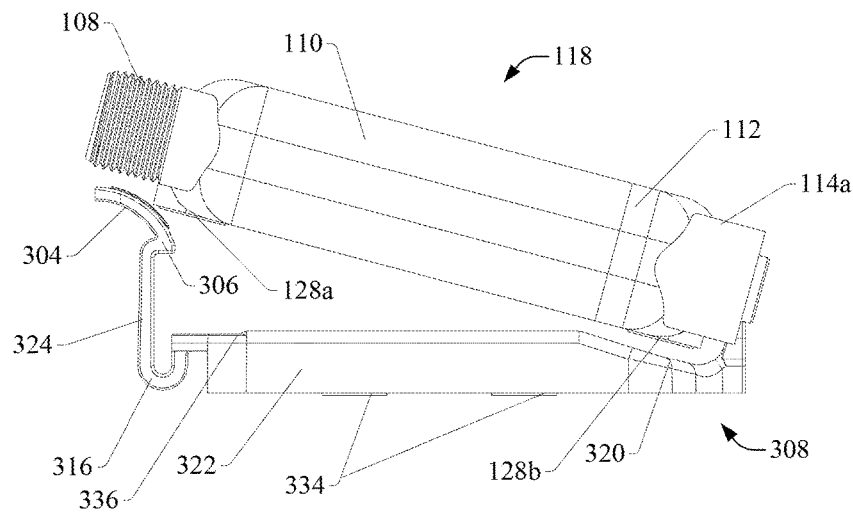
FIG. 6C is an exterior side view of a sensor housing and snap-fit bracket depicting a second step for mounting the housing to the bracket.
Figure 6D:
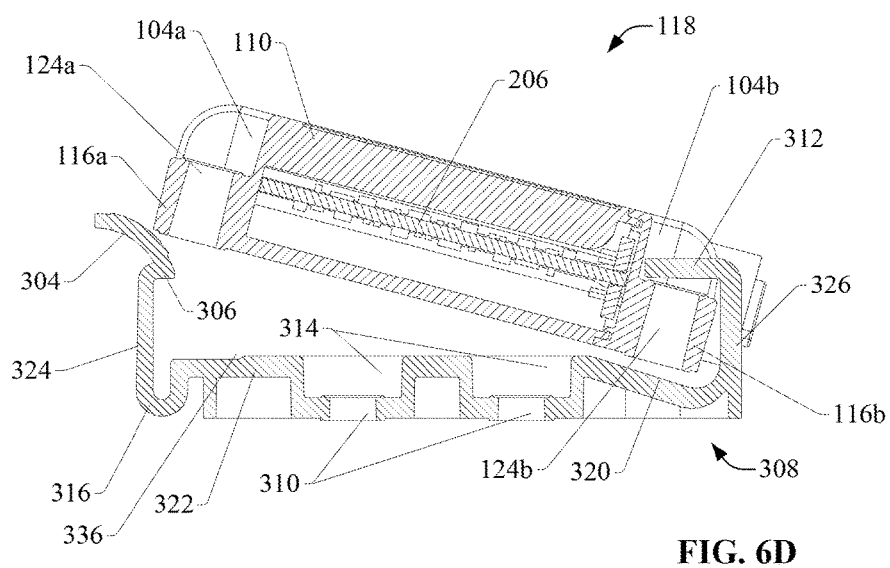
FIG. 6D is a cross-sectional side view of a sensor housing and snap-fit bracket depicting a second step for mounting the housing to the bracket.

In a second step depicted in FIGS. 6C and 6D, the housing 118 with integral pockets 104a and 104b is inserted under the overhang feature 312 of the bracket 308. Specifically, the mounting boss 116b on one end of the housing 118 is inserted under the overhang feature 312. The pocket 104b within which the mounting boss 116b is located has a width that is sufficient to accommodate the width of the overhang feature 312. The width of the pocket 104b can be designed to be only slightly wider than the width of the overhang feature 312 in order to limit lateral movement of the housing 118 while the housing 118 is installed in the bracket 308. The angled portion 320 of bracket 308 provides clearance for the mounting boss 116b as the mounting boss 116b is being inserted under the overhang feature 312 during this step. That is, the mounting boss 116b is inserted into the space defined by the angled portion 320, the second arm 326, and the overhang feature 312.

Figure 6E:
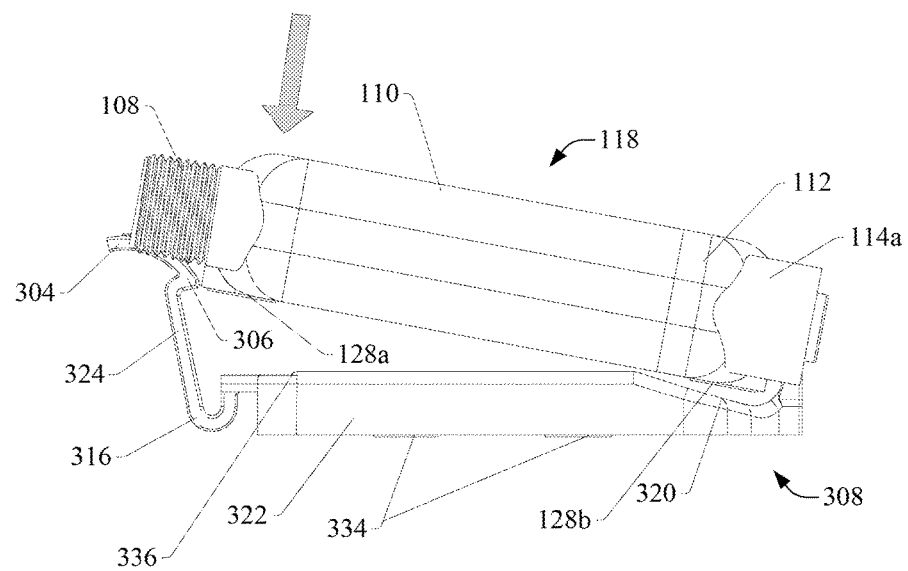
FIG. 6E is an exterior side view of a sensor housing and snap-fit bracket depicting a third step for mounting the housing to the bracket.
Figure 6F:
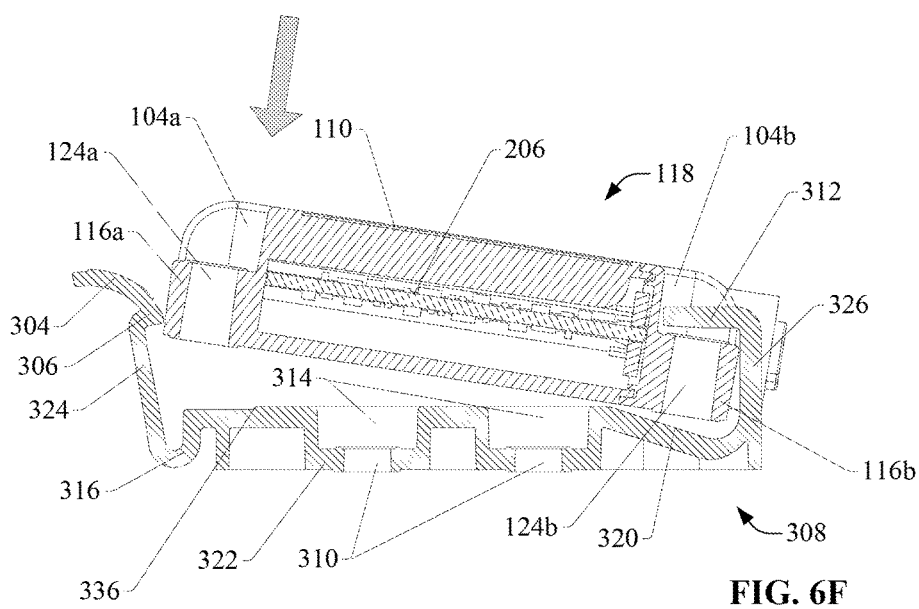
FIG. 6F is a cross-sectional side view of a sensor housing and snap-fit bracket depicting a third step for mounting the housing to the bracket.

In a third step depicted in FIGS. 6E and 6F, after the mounting boss 116b of the housing 118 is inserted under the overhang feature 312 of the bracket 308, the end of the housing 118 containing the other mounting boss 116a (the end of the housing 118 opposite the end that is being held by the overhang feature 312) is pressed downward (the general direction of applied force indicated by the arrows in FIGS. 6E and 6F). This causes the first arm 324 of the bracket 308 to flex outward as the mounting boss 116a on the housing 118 makes contact with the extended tab 304 and snap feature 306 on the first arm 324. The U-shaped bend 316 can afford the first arm 324 a degree of flexibility that can ease the transition of the housing during this step.

Figure 6G:
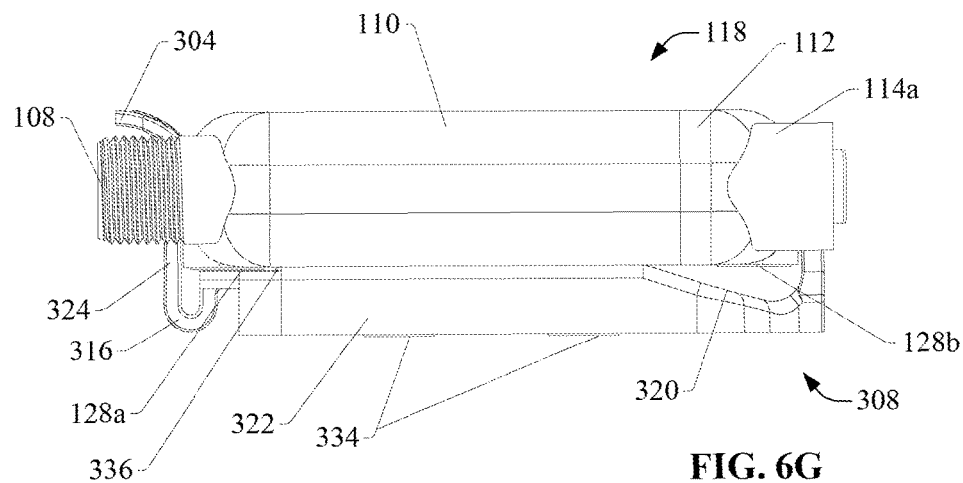
FIG. 6G is an exterior side view of a sensor housing and snap-fit bracket depicting a fourth step for mounting the housing to the bracket.
Figure 6H:
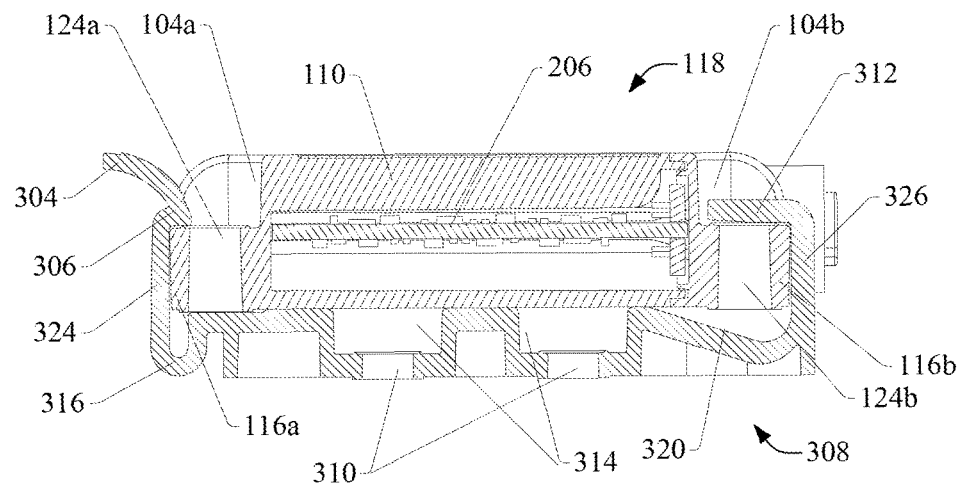
FIG. 6H is a cross-sectional side view of a sensor housing and snap-fit bracket depicting a fourth step for mounting the housing to the bracket.

In a final step, as depicted in FIGS. 6G and 6H, the force applied in the previous step is maintained until the housing 118 is pressed completely against the bracket 308. When the housing 118 is pressed down until the bottom side of the housing 118 rests against the top surface of the bracket 3308, the snap feature 306 of the first arm 324 clears the top of mounting boss 116a, causing the first arm 324 to spring back to its substantially vertical position, which in turn causes the snap feature 306 to latch over the edge of the mounting boss 116a on the housing 118, thereby securing the housing 118 in place on the bracket 308. The width of the pocket 104a within which mounting boss 116a is located can be designed to be only slightly wider than the width of the snap feature 306, thereby limiting sideways motion of the housing 118 while mounted to bracket 308.

FIG. 7A is a detailed side view of the latching interaction between the snap feature 306 and the mounting boss 116a while the housing 118 is engaged with the bracket 308. As can be seen in this view, the snap feature 306 fits over the annular crush ring 126a that surrounds the mounting hole 124a of mounting boss 116a. FIG. 7B is a detailed side view of the latching interaction between the overhang feature 312 and the mounting boss 116b while the housing 118 is engaged with the bracket 308. Similar to the snap feature 306, in some embodiments the overhang feature 312 fits over the annular crush ring 126b that surrounds mounting hole 124b of mounting boss 116b. Alternatively, some embodiments may omit the annular crush rings 126a and 126b. In such embodiments, the snap feature 306 and overhang feature 312 fit over the mounting bosses 116a and 116b directly.

The latching interactions between the snap feature 306 and mounting boss 116a, and between overhang feature 312 and mounting boss 116b, prevent excessive movement of the housing 118 along at least three axes (the X, Y, and Z axes) simultaneously. Thus, the sensor 102 enclosed within housing 118 is secured against environmental effects such as shock and vibration. In this manner, the sensor 102 can be quickly and easily assembled to the bracket 308 without the use of additional tools. In order to disengage the sensor housing 118 from the bracket 308, pressure can be applied to the extended tab 304, causing the first arm 324 to flex outward and the snap feature 306 to disengage from the mounting boss 116a, thereby allowing the housing 118 to be removed from the bracket 308. The sensor 102 can thus be quickly disassembled from the bracket 308 without the use of additional tools by reversing the steps illustrated in FIGS. 6A-6H.

Since the pockets 104a and 104b and their associated mounting bosses 116a and 116b at the respective ends of housing 118 are symmetrical, the housing 118 can be installed on the bracket in either of two orientations. In the first orientation, depicted in FIGS. 6A-6H, mounting boss 116b is installed under the overhang feature 312, while mounting boss 116a is held in place by snap feature 306. The orientation of the housing 118 can also be rotated 180 degrees, such that mounting boss 116a is installed under the overhang feature 312 while mounting boss 116b is held in place by snap feature 306.

Figure 8A:
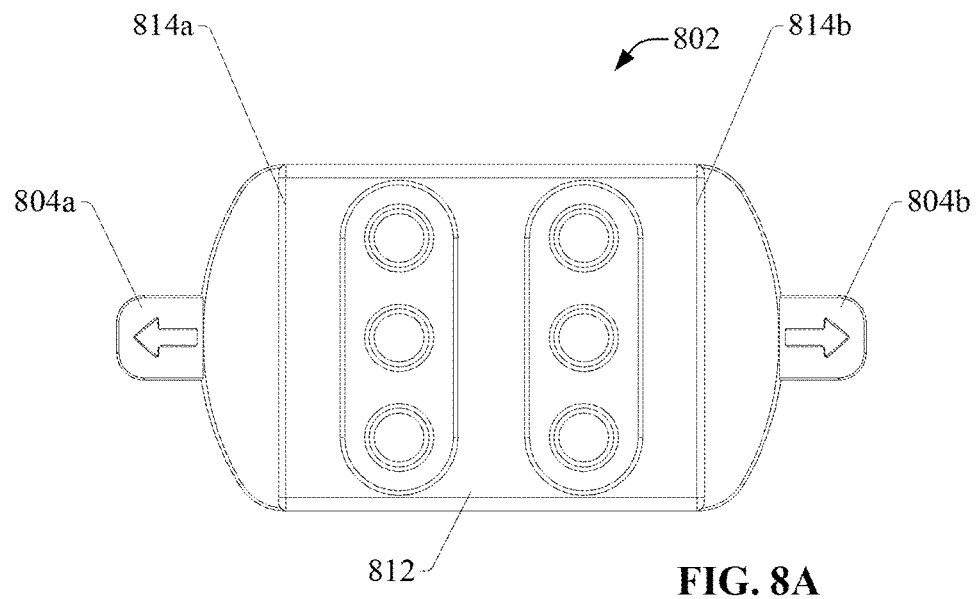
FIG. 8A is a top view of a bracket having an alternative design.
Figure 8B:
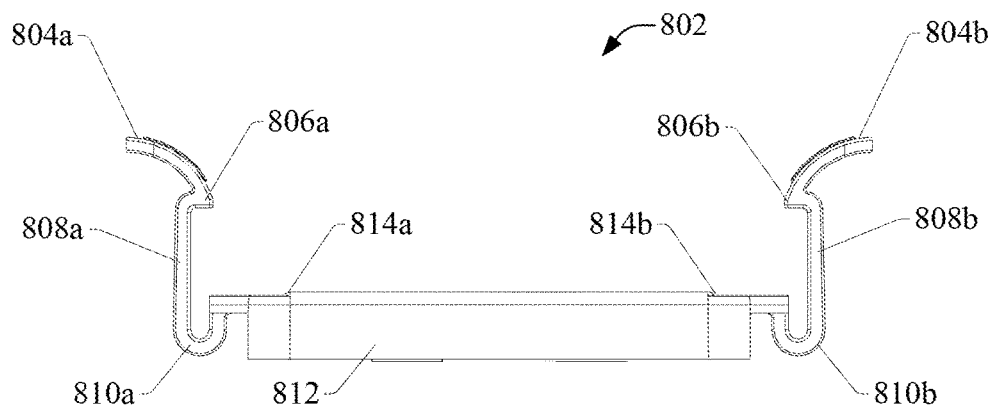
FIG. 8B is a side view of the bracket having an alternative design.

FIG. 8A is a top view of a bracket 802 having an alternative design relative to bracket 308. FIG. 8B is a side view of bracket 802. Bracket 802 includes a first arm 808a with a snap feature 806a, extended tab 804a, and U-shaped bend 810a attached to a first end of a main bracket body 812. These elements are similar to the corresponding first arm 324, a snap feature 306, extended tab 304, and U-shaped bend 316 of bracket 308. However, rather than having a second arm with an overhang feature on the opposite end of the main bracket body, the opposite end of main bracket body 812 has attached thereto a second snap feature 806 and extended tab 804b attached to a second arm 808b and U-shaped bend 810b. Step features 814a and 814b are formed on the top surface of main bracket body 812 to accommodate the raised pads 128*a* and 128*b* on the bottom of housing 118. In this embodiment, either of the arms 808*a* or 808*b* can be flexed outward in order to release housing 118.

Figure 9C:
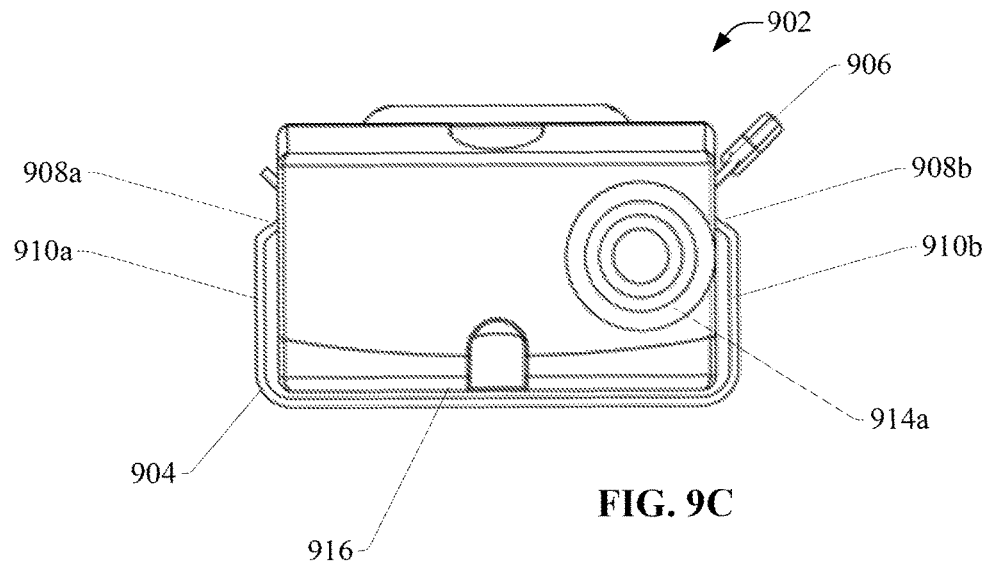
FIG. 9C is a front view of the housing and bracket having the other alternative design.
Figure 9D:
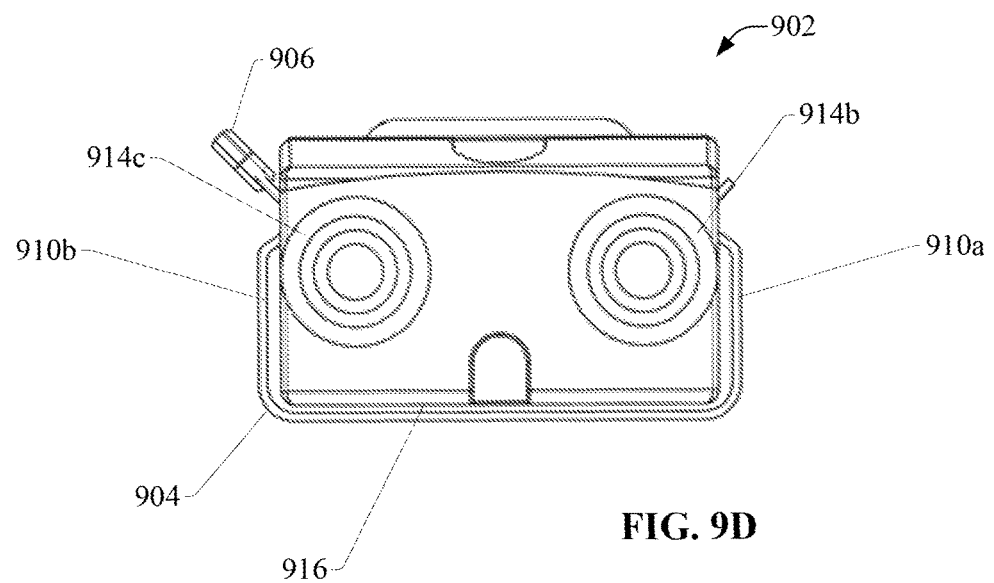
FIG. 9D is a rear view of the housing and bracket having the other alternative design.

FIG. 9A is an orthographic view of a sensor housing 902 and bracket 904 having an alternative design relative to housing 118 and bracket 308. FIG. 9B is a top view of housing 902 affixed to bracket 904. FIGS. 9C and 9D are front and rear views, respectively, of housing 902 affixed to bracket 904. FIGS. 9E and 9F are left and right side views, respectively, of housing 902 affixed to bracket 904. The design of housing 902 differs from that of housing 118 in that, instead of mounting bosses located on the front and rear ends of the housing, pockets are located on the left and right sides of housing 902. Engagement features 908*a* and 908*b* on the respective arms 910*a* and 910*b* of bracket 904 are configured to engage with the side-mounted pockets of housing 902. The engagement features 908*a* and 908*b* can have any suitable shape or profile (e.g., rounded or U-shaped, square, triangular, etc.), with the pockets having a shape corresponding to the shape of the engagement features. To facilitate engagement with these side-mounted pockets, bracket 904 is rotated 90 degrees relative to bracket 308, so that the arms 910*a* and 910*b* of bracket 904 engage with the side-mounted pockets. The housing 902 can be released from bracket 904 by applying pressure to an extended tab 906 on one of the arms of bracket 904, thereby disengaging the arm from the its side-mounted pocket.

The bracket 904 itself can be mounted to a mounting surface using suitable hardware. In embodiments in which bracket 904 is mounted to a surface using bolts or screws, the bottom surface 916 of housing 902 can have recessed areas formed thereon to accommodate the heads of the bolts or screws, allowing the housing 902 to rest flush on the top surface of the bracket 904. In other embodiments, the bottom segment of bracket 904 can be formed with a greater thickness than that shown in FIGS. 9A-9E, and recessed pockets similar to pockets 314 can be formed on the top surface of the bottom segment. In this way, the heads of the bolts or screws do not interfere with the bottom surface 916 of housing 902.

Two recessed mounting holes 912*a* and 912*b* are located on respective front and rear ends of housing 902 to facilitate mounting the housing on a mounting surface without the use of bracket 904. This provides an alternative mounting method, allowing housing 902 to be mounted using either bracket 904 or mounting hardware installed through mounting holes 912*a* and 912*b*.

In the illustrated example, housing 902 includes three cables 914*a*, 914*b*, and 914*c* that interface with the sensor electronics contained within the housing 902. However, housing 902 is not limited to a three-cable embodiment; rather, housing 902 can be configured to accommodate any number of input, output, power, and/or data cables without departing from the scope of one or more embodiments of this disclosure.

Figure 10:
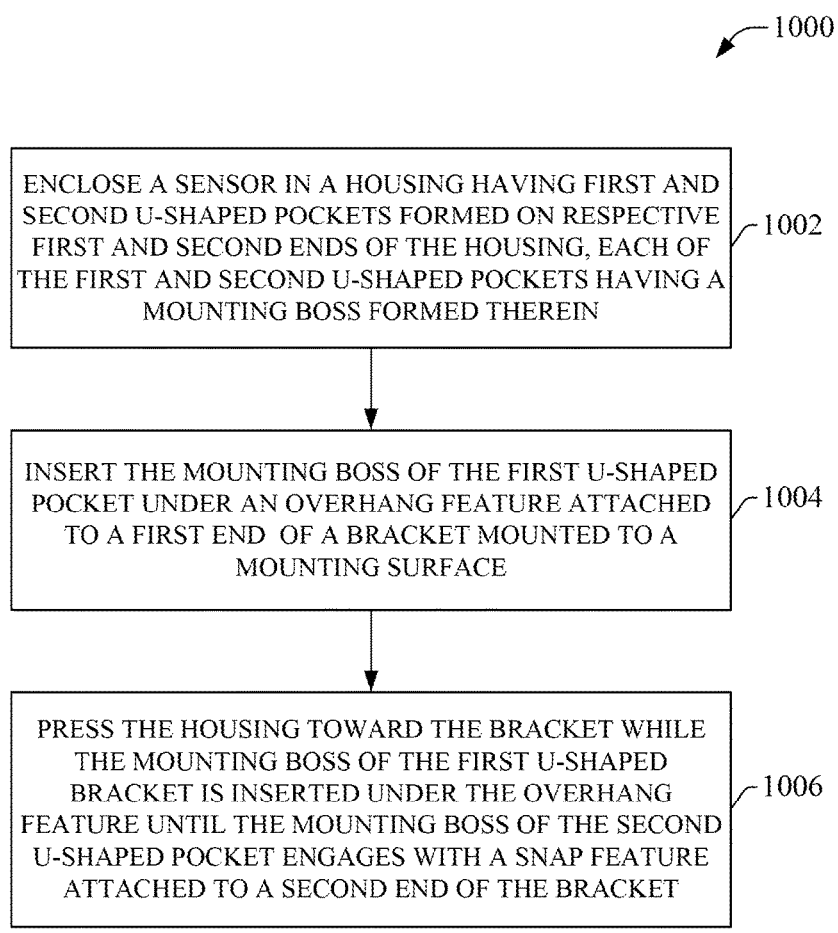
FIG. 10 is a flowchart of an example methodology for mounting a sensor housing to a bracket.

FIG. 10 illustrates a methodology in accordance with one or more embodiments of the subject application. While, for purposes of simplicity of explanation, the methodology shown herein is shown and described as a series of acts, it is to be understood and appreciated that the subject innovation is not limited by the order of acts, as some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the innovation. Furthermore, interaction diagram(s) may represent methodologies, or methods, in accordance with the subject disclosure when disparate entities enact disparate portions of the methodologies. Further yet, two or more of the disclosed example methods can be implemented in combination with each other, to accomplish one or more features or advantages described herein.

FIG. 10 illustrates an example methodology 1000 for mounting a sensor housing to a bracket. Initially, at 1002, a sensor is enclosed in a housing having first and second U-shaped pockets formed on respective first and second ends of the housing, each of the first and second U-shaped pockets having a mounting boss formed therein. At 1004, the mounting boss of the first U-shaped pocket is inserted under an overhang feature attached to a first end of a bracket mounted to a mounting surface. At 1006, the housing is pressed toward the bracket while the mounting boss of the first U-shaped bracket is inserted under the overhang feature until the mounting boss of the second U-shaped pocket engages with a snap feature attached to a second end of the bracket.

What has been described above includes examples of the subject innovation. It is, of course, not possible to describe every conceivable combination of components or methodologies for purposes of describing the disclosed subject matter, but one of ordinary skill in the art may recognize that many further combinations and permutations of the subject innovation are possible. Accordingly, the disclosed subject matter is intended to embrace all such alterations, modifications, and variations that fall within the spirit and scope of the appended claims.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the disclosed subject matter. In this regard, it will also be recognized that the disclosed subject matter includes a system for performing the acts and/or events of the various methods of the disclosed subject matter.

In addition, while a particular feature of the disclosed subject matter may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising."

In this application, the word "exemplary" is used to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Various aspects or features described herein may be implemented as a method, apparatus, or article of manufacture using standard programming and/or engineering techniques.

What is claimed is:

1. A system for mounting an industrial sensor, comprising:
a bracket comprising a snap feature and an overhang feature; and
a housing of an industrial sensor, comprising:
hollow threaded connectors that provide access to respective data ports or power ports of the industrial sensor, wherein two of the hollow threaded connectors protrude from a first end of the housing;
a first pocket located at the first end of the housing between the two of the hollow threaded connectors;
a first mounting boss located within the first pocket and configured to engage with either the snap feature or the overhang feature;
a second pocket located at a second end of the housing; and
a second mounting boss located within the second pocket and configured to engage with either the snap feature or the overhang feature.

2. The system of claim 1, wherein the bracket further comprises:
a main bracket body comprising a top surface and a bottom surface;
a first arm attached to a first end of the main bracket body and extending substantially perpendicular to a plane of the top surface of the main bracket body, the first arm comprising the snap feature configured to engage with either of the first mounting boss or the second mounting boss; and
a second arm attached to a second end of the main bracket body and extending substantially perpendicular to the plane of the top surface of the main bracket body, the second arm comprising the overhang feature configured to engage with either of the first mounting boss or the second mounting boss.

3. The system of claim 2, wherein the snap feature and the overhang feature are offset from the plane of the top surface of the main bracket body by a substantially same distance, and wherein the distance substantially corresponds to a height of the first mounting boss and the second mounting boss.

4. The system of claim 2, wherein the first arm further comprises an extended tab, and wherein applying pressure to the extended tab causes the first arm to flex away from the main bracket body and disengage from the first mounting boss or the second mounting boss.

5. The system of claim 2, wherein a base of the first arm comprises a U-shaped bend comprising a first leg that is continuous with a main portion of the first arm and a second leg attached to a bottom surface of a ledge formed on the first end of the main bracket body.

6. The system of claim 2, wherein
the top surface of the main bracket body comprises an angled portion that slopes downwardly toward a base of the second arm, and
the angled portion, the second arm, and the overhang feature form a space for insertion of the first mounting boss or the second mounting boss.

7. The system of claim 2, wherein
the bracket further comprises two or more elongated pockets formed on the top surface of the main bracket body, and
at least one mounting hole is formed through a bottom of the respective elongated pockets.

8. The system of claim 1, wherein a first mounting hole and a second mounting hole are formed in the first mounting boss and the second mounting boss, respectively.

9. The system of claim 2, wherein the first pocket, the second pocket, and the overhang feature are substantially U-shaped.

10. The system of claim 2, wherein the housing is configured to mount to the bracket in a first orientation in which the snap feature engages with the first mounting boss and the overhang feature engages with the second mounting boss, and in a second orientation in which the snap feature engages with the second mounting boss and the overhang feature engages with the first mounting boss.

11. The system of claim 4, wherein the extended tab curves away from the snap feature in a direction away from the main bracket body.

12. The system of claim 1, wherein the industrial sensor is at least one of a photo-electric sensor, an inductive proximity sensor, or a safety sensor.

* * * * *